(12) United States Patent
Yeh et al.

(10) Patent No.: US 11,710,519 B2
(45) Date of Patent: Jul. 25, 2023

(54) HIGH DENSITY MEMORY WITH REFERENCE MEMORY USING GROUPED CELLS AND CORRESPONDING OPERATIONS

(71) Applicant: Macronix International Co., Ltd., Hsinchu (TW)

(72) Inventors: Teng-Hao Yeh, Hsinchu (TW);
Hang-Ting Lue, Hsinchu (TW);
Cheng-Lin Sung, Taichung (TW);
Yung-Feng Lin, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 10 days.

(21) Appl. No.: 17/368,705

(22) Filed: Jul. 6, 2021

(65) Prior Publication Data

US 2023/0007890 A1    Jan. 12, 2023

(51) Int. Cl.
*G11C 7/12*     (2006.01)
*G11C 11/4091*  (2006.01)
*G11C 11/4074*  (2006.01)
*G11C 11/408*   (2006.01)
*G11C 11/4094*  (2006.01)
*G11C 11/4099*  (2006.01)
*G11C 16/10*    (2006.01)
*G11C 16/28*    (2006.01)

(52) U.S. Cl.
CPC ...... *G11C 11/4091* (2013.01); *G11C 11/4074* (2013.01); *G11C 11/4085* (2013.01); *G11C 11/4094* (2013.01); *G11C 11/4099* (2013.01); *G11C 16/102* (2013.01); *G11C 16/28* (2013.01)

(58) Field of Classification Search
CPC .................................................. G11C 11/4091
See application file for complete search history.

(56) References Cited

U.S. PATENT DOCUMENTS

| 4,219,829 A | 8/1980 | Dorda et al. |
| 4,987,090 A | 1/1991 | Hsu et al. |
| 5,586,073 A | 12/1996 | Hiura et al. |
| 6,034,882 A | 3/2000 | Johnson et al. |

(Continued)

FOREIGN PATENT DOCUMENTS

| CN | 109360593 A | 2/2019 |
| TW | 533528 B | 5/2003 |

(Continued)

OTHER PUBLICATIONS

TW Office Action from 11021272070 with English machine translation, dated Dec. 28, 2021, 10 pages.

(Continued)

*Primary Examiner* — Min Huang
(74) *Attorney, Agent, or Firm* — Andrew L. Dunlap; Haynes Beffel & Wolfeld LLP

(57) ABSTRACT

A memory device includes a high density or 3D data memory and a 3D reference memory. The reference memory is used to generate a reference signal used to sense data in the data memory. Conversion circuitry converts signals from one memory cell or a group of memory cells in the reference memory into a reference signal. The reference signal is applied to a sense amplifier to sense data stored in a selected memory cell in the data memory.

17 Claims, 17 Drawing Sheets

(56) References Cited

U.S. PATENT DOCUMENTS

| | | | |
|---|---|---|---|
| 6,107,882 A | 8/2000 | Gabara et al. | |
| 6,313,486 B1 | 11/2001 | Kencke et al. | |
| 6,317,362 B1 | 11/2001 | Nomura et al. | |
| 6,385,097 B1 | 5/2002 | Liao et al. | |
| 6,486,027 B1 | 11/2002 | Noble et al. | |
| 6,576,385 B2 | 6/2003 | Bode et al. | |
| 6,593,624 B2 | 7/2003 | Walker | |
| 6,829,598 B2 | 12/2004 | Milev | |
| 6,906,940 B1 | 6/2005 | Lue | |
| 6,960,499 B2 | 11/2005 | Nandakumar et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,324,381 B2 | 1/2008 | Gallo et al. | |
| 7,368,358 B2 | 5/2008 | Ouyang et al. | |
| 7,646,041 B2 | 1/2010 | Chae et al. | |
| 7,747,668 B2 | 6/2010 | Nomura et al. | |
| 7,948,024 B2 | 5/2011 | Kim et al. | |
| 8,045,355 B2 | 10/2011 | Ueda | |
| 8,154,128 B2 | 4/2012 | Lung | |
| 8,174,865 B2 | 5/2012 | Rhie et al. | |
| 8,203,187 B2 | 6/2012 | Lung et al. | |
| 8,275,728 B2 | 9/2012 | Pino | |
| 8,331,149 B2 | 12/2012 | Choi et al. | |
| 8,432,719 B2 | 4/2013 | Lue | |
| 8,564,045 B2 | 10/2013 | Liu | |
| 8,589,320 B2 | 11/2013 | Breitwisch et al. | |
| 8,630,114 B2 | 1/2014 | Lue | |
| 8,860,124 B2 | 10/2014 | Lue et al. | |
| 9,064,903 B2 | 6/2015 | Mitchell et al. | |
| 9,111,617 B2 | 8/2015 | Shim et al. | |
| 9,147,468 B1 | 9/2015 | Lue | |
| 9,177,966 B1 | 11/2015 | Rabkin et al. | |
| 9,379,129 B1 | 6/2016 | Lue et al. | |
| 9,397,110 B2 | 7/2016 | Lue | |
| 9,401,371 B1 | 7/2016 | Lee et al. | |
| 9,430,735 B1 | 8/2016 | Vali et al. | |
| 9,431,099 B2 | 8/2016 | Lee et al. | |
| 9,520,485 B2 | 12/2016 | Lue | |
| 9,524,980 B2 | 12/2016 | Lue | |
| 9,536,969 B2 | 1/2017 | Yang et al. | |
| 9,589,982 B1 | 3/2017 | Cheng et al. | |
| 9,698,156 B2 | 7/2017 | Lue | |
| 9,698,185 B2 | 7/2017 | Chen et al. | |
| 9,710,747 B2 | 7/2017 | Kang et al. | |
| 9,754,953 B2 | 9/2017 | Tang et al. | |
| 9,922,716 B2 | 3/2018 | Hsiung et al. | |
| 10,043,819 B1 | 8/2018 | Lai et al. | |
| 10,121,553 B2 | 11/2018 | Harari | |
| 10,211,218 B2 | 2/2019 | Lue | |
| 10,242,737 B1 | 3/2019 | Lin et al. | |
| 10,403,637 B2 | 9/2019 | Lue | |
| 10,777,566 B2 | 9/2020 | Lue | |
| 10,790,023 B2 | 9/2020 | Harari | |
| 10,910,393 B2 | 2/2021 | Lai et al. | |
| 11,069,704 B2 | 7/2021 | Lai et al. | |
| 2001/0055838 A1 | 12/2001 | Walker et al. | |
| 2002/0028541 A1 | 3/2002 | Lee et al. | |
| 2003/0122181 A1 | 7/2003 | Wu | |
| 2005/0280061 A1 | 12/2005 | Lee | |
| 2005/0287793 A1 | 12/2005 | Blanchet et al. | |
| 2006/0072357 A1* | 4/2006 | Wicker | G11C 11/5678 |
| | | | 365/163 |
| 2006/0233028 A1 | 10/2006 | Suitou et al. | |
| 2007/0002639 A1 | 1/2007 | Ogawa et al. | |
| 2007/0019469 A1 | 1/2007 | Motoki | |
| 2007/0158736 A1 | 7/2007 | Arai et al. | |
| 2008/0101109 A1 | 5/2008 | Haring-Bolivar et al. | |
| 2008/0117678 A1 | 5/2008 | Shieh et al. | |
| 2009/0097321 A1 | 4/2009 | Kim et al. | |
| 2009/0184360 A1 | 7/2009 | Jin et al. | |
| 2010/0182828 A1 | 7/2010 | Shima et al. | |
| 2010/0202208 A1 | 8/2010 | Endo et al. | |
| 2010/0270593 A1 | 10/2010 | Lung et al. | |
| 2011/0018051 A1 | 1/2011 | Kim et al. | |
| 2011/0063915 A1 | 3/2011 | Tanaka et al. | |
| 2011/0106742 A1 | 5/2011 | Pino | |
| 2011/0140070 A1 | 6/2011 | Kim | |
| 2011/0286258 A1 | 11/2011 | Chen et al. | |
| 2011/0297912 A1 | 12/2011 | Samachisa et al. | |
| 2012/0033518 A1 | 2/2012 | Hung et al. | |
| 2012/0044742 A1 | 2/2012 | Narayanan | |
| 2012/0112264 A1 | 5/2012 | Lee et al. | |
| 2012/0235111 A1 | 9/2012 | Osano et al. | |
| 2013/0075684 A1 | 3/2013 | Kinoshita et al. | |
| 2013/0119455 A1 | 5/2013 | Chen et al. | |
| 2014/0063949 A1 | 3/2014 | Tokiwa | |
| 2014/0119127 A1 | 5/2014 | Lung et al. | |
| 2014/0149773 A1 | 5/2014 | Huang et al. | |
| 2014/0268996 A1 | 9/2014 | Park | |
| 2015/0008500 A1 | 1/2015 | Fukumoto et al. | |
| 2015/0179661 A1 | 6/2015 | Huo et al. | |
| 2015/0340369 A1 | 11/2015 | Lue | |
| 2015/0364187 A1* | 12/2015 | Kim | G11C 11/1675 |
| | | | 365/148 |
| 2016/0005762 A1 | 1/2016 | Lue | |
| 2016/0043100 A1 | 2/2016 | Lee et al. | |
| 2016/0085444 A1* | 3/2016 | Tanzawa | G11C 7/04 |
| | | | 711/167 |
| 2016/0141299 A1 | 5/2016 | Hong | |
| 2016/0141337 A1 | 5/2016 | Shimabukuro et al. | |
| 2016/0181315 A1 | 6/2016 | Lee et al. | |
| 2016/0247579 A1 | 8/2016 | Ueda et al. | |
| 2016/0308114 A1 | 10/2016 | Kim et al. | |
| 2016/0329341 A1 | 11/2016 | Shimabukuro et al. | |
| 2016/0336064 A1 | 11/2016 | Seo et al. | |
| 2016/0343421 A1 | 11/2016 | Pyo | |
| 2016/0358661 A1 | 12/2016 | Vali et al. | |
| 2017/0084748 A1 | 3/2017 | Yang | |
| 2017/0092370 A1 | 3/2017 | Harari | |
| 2017/0148517 A1 | 5/2017 | Harari | |
| 2017/0169887 A1 | 6/2017 | Widjaja | |
| 2017/0243879 A1 | 8/2017 | Yu et al. | |
| 2017/0270405 A1 | 9/2017 | Kurokawa | |
| 2017/0287928 A1 | 10/2017 | Kanamori et al. | |
| 2017/0309634 A1 | 10/2017 | Noguchi et al. | |
| 2017/0316833 A1 | 11/2017 | Ihm et al. | |
| 2017/0317096 A1 | 11/2017 | Shin et al. | |
| 2018/0121790 A1 | 5/2018 | Kim et al. | |
| 2018/0182776 A1 | 6/2018 | Kim | |
| 2018/0350823 A1 | 12/2018 | Or-Bach et al. | |
| 2019/0148393 A1 | 5/2019 | Lue | |
| 2019/0220249 A1 | 7/2019 | Lee et al. | |
| 2019/0244662 A1 | 8/2019 | Lee et al. | |
| 2019/0286419 A1 | 9/2019 | Lin et al. | |
| 2019/0319044 A1 | 10/2019 | Harari | |
| 2020/0026993 A1 | 1/2020 | Otsuka | |
| 2020/0098784 A1 | 3/2020 | Nagashima et al. | |
| 2020/0227432 A1 | 7/2020 | Lai et al. | |
| 2020/0258572 A1* | 8/2020 | Bandyopadhyay | |
| | | | H01L 27/2427 |
| 2020/0343252 A1 | 10/2020 | Lai et al. | |
| 2020/0381450 A1 | 12/2020 | Lue et al. | |

FOREIGN PATENT DOCUMENTS

| | | |
|---|---|---|
| TW | I310559 B | 6/2009 |
| WO | 2017091338 A1 | 6/2017 |

OTHER PUBLICATIONS

EP Extended SR from 21199663.2, dated Mar. 11, 2022, 10 pages.

Chen et al., "Eyeriss: an Energy-Efficient reconfigurable accelerator for deep convolutional neural networks," IEEE ISSCC, Jan. 31-Feb. 4, 2016, 3 pages.

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.

Gonugondla et al., "Energy-Efficient Deep In-memory Architecture for NAND Flash Memories," IEEE International Symposium on Circuits and Systems (ISCAS), May 27-30, 2018, 5 pages.

(56) References Cited

OTHER PUBLICATIONS

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.
Hubert et al., "A Stacked SONOS Technology, Up to 4 Levels and 6nm Crystalline Nanowires, With Gate-All-Around an Independent Gates (Flash), Suitable for Full 3D Integration," IEEE 2009, Dec. 7-9, 2009, pp. 27.6.1-27.6.4.
Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.
Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.
Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.
Katsumata et al., "Pipe-shaped BiCS flash memory with 16 stacked layers and multi-level-cell operation for ultra high density storage devices," 2009 Symp. on VLSI Technology, Jun. 16-18, 2009, 2 pages.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187.
Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Lai et al. "Highly Reliable MA BE-SONOS (Metal-Al203 Bandgap Engineered SONOS) Using a SiO2 Buffer Layer," VLSI Technology, Systems and Applications 2008, VLSI-TSA International Symposium on Apr. 21-23, 2008, pp. 58-59.
Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.
Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.
Lue et al., "A Novel Buried-Channel FinFET BE-SONOS NAND Flash with Improved Memory Window and Cycling Endurance", 2009 Symposium on VLSI Technology Digest of Technical Papers, p. 224-225.
Meena, et al., "Overview of emerging nonvolatile memory technologies," Nanoscale Reearch Letters 9:526, Oct. 2, 2014, 34 pages.
Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.
Paul et al., "Impact of a Process Variation on Nanowire and Nanotube Device Performance", IEEE Transactions on Electron Devices, vol. 54, No. 9, Sep. 2007, p. 2369-2376.
Rincon-Mora, et al., "Bandgaps in the crosshairs: What's the trim target?" IEEE, The Georgia Tech Analog & Power IC Labroator, Oct. 18, 2006, 5 pages.
Sakai et al., "A Buried Giga-Ohm Resistor (BGR) Load Static RAM Cell," IEEE Symp. on VLSI Technology, Digest of Papers, Sep. 10-12, 1984, 2 pages.
Schuller et al., "Neuromorphic Computing: From Materials to Systems Architecture," US Dept. of Energy, Oct. 29-30, 2015, Gaithersburg, MD, 40 pages.
Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.
Soudry, et al. "Hebbian learning rules with memristors," Center for Communication and Information Technologies CCIT Report #840, Sep. 1, 2013, 16 pages.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
U.S. Appl. No. 17/170,542, filed Feb. 8, 2021, 46 pages.
U.S. Appl. No. 17/230,114, filed Apr. 14, 2021, 96 Pages.
Wang et al., "Three-Dimensional NAND Flash for Vector-Matrix Multiplication," IEEE Trans. on Very Large Scale Integration Systems (VLSI), vol. 27, No. 4, Apr. 2019, 4 pages.
Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.
EP Extended SR from 21199659.0, dated Mar. 25, 2022, 10 pages.
TW Office Action from 11120957210 with English machine translation, dated Sep. 28, 2022, 9 pages.

* cited by examiner

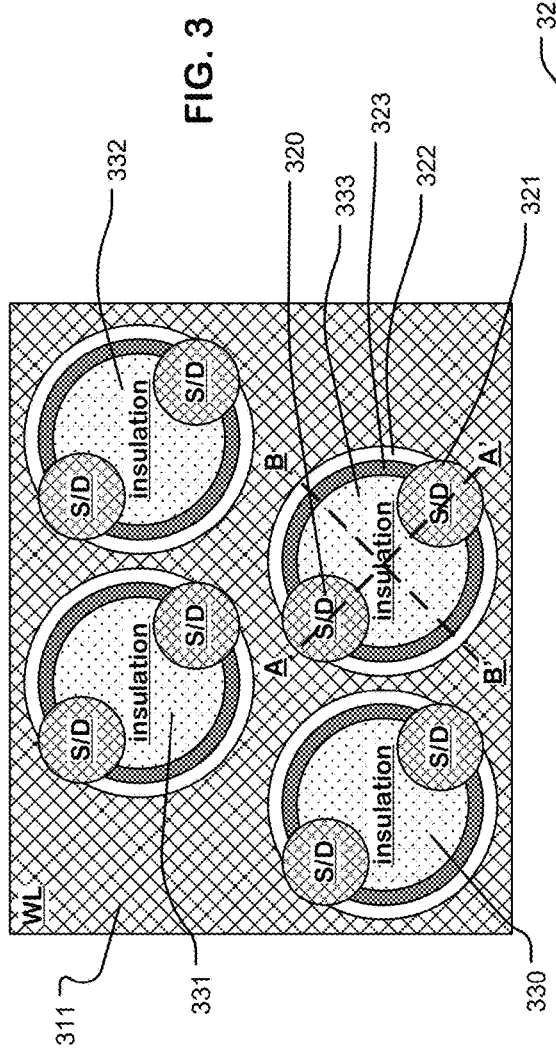
FIG. 3
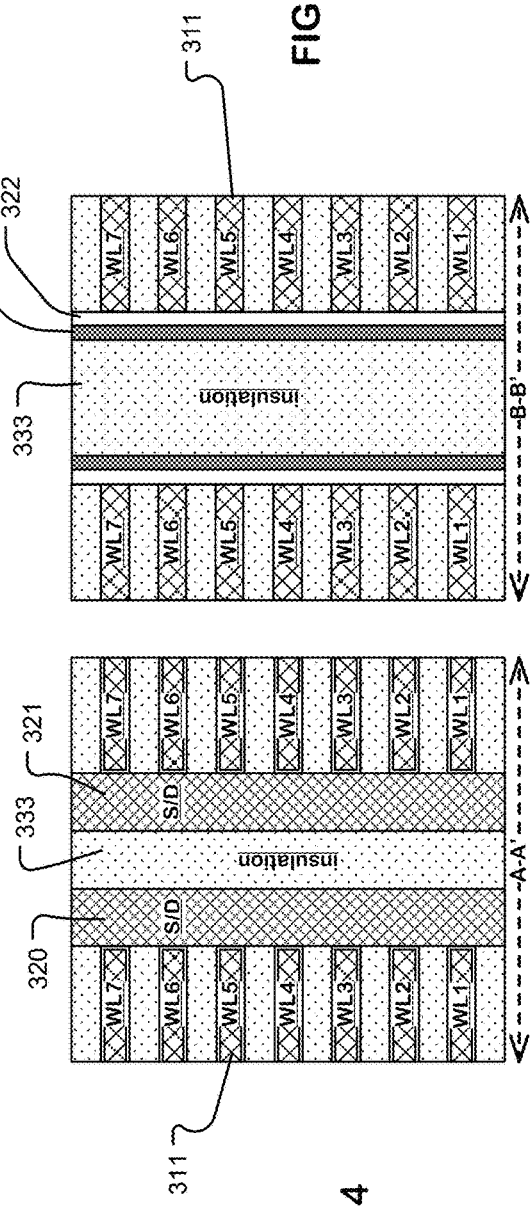
FIG. 4
FIG. 5

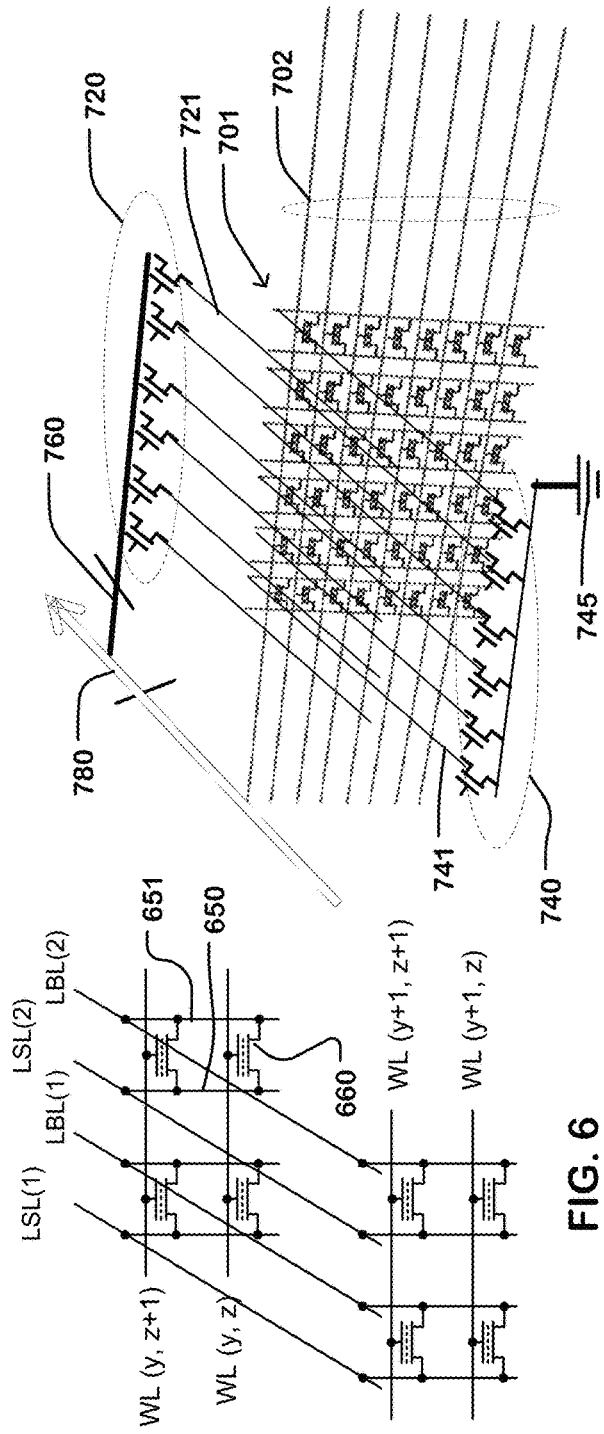
FIG. 6
FIG. 7
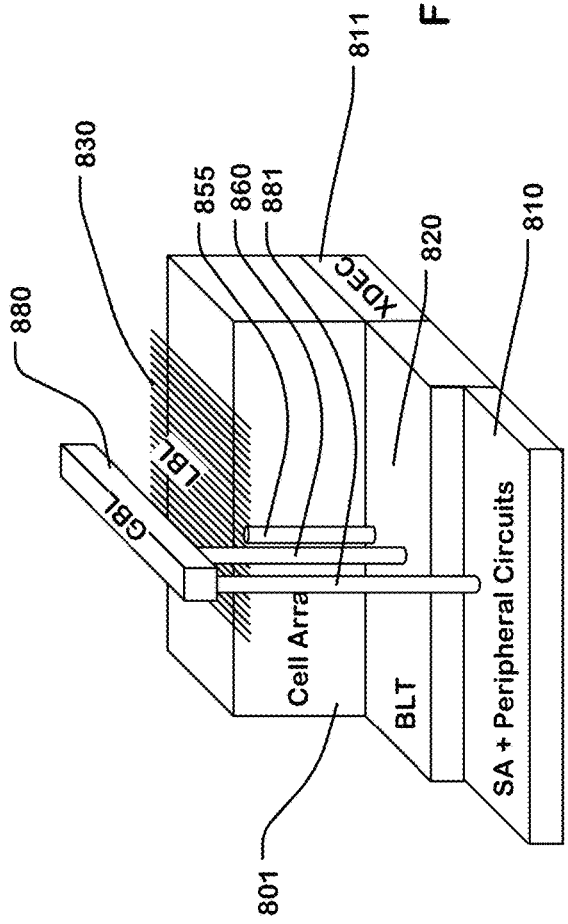
FIG. 8

HIGH DENSITY MEMORY WITH REFERENCE MEMORY USING GROUPED CELLS AND CORRESPONDING OPERATIONS

BACKGROUND

Field

The present invention relates to configurations of circuits for sensing data in memory integrated circuits, and more particularly in 3D non-volatile memory integrated circuits.

Description of Related Art

In high density memory, such as memory, process, voltage and temperature PVT, conditions have variant impact on performance of memory cells in different devices, and within individual devices. This issue is reflected in the design of sensing circuits. For example, some sense amplifier schemes involve generating a voltage from a selected memory cell, and comparing that voltage to a reference voltage. The voltages generated from selected memory cells can vary with PVT conditions across devices and across different parts of individual devices. These variations expand the sensing margins between data states required for the sensing circuits. When the sensing margins are high, high voltage sensing circuits are required for reliable operation. High voltage sensing circuits may be incompatible with, or difficult to implement with, modern memory technologies.

Also, such variations in the reference voltage can contribute to expanded sensing margins. The reference voltage can be produced using a bandgap reference for example. However, bandgap reference circuits are not immune to process and temperature variations, and such variations may behave differently from the memory cells. This problem with PVT variations also contributes to expanding the sensing margins required for reliable operation.

It is desirable to provide a technology that can improve sensing margins in high density memory, such as 3D flash memory.

SUMMARY

A technology is described for a memory device including a data memory and a reference memory, and using the reference memory to generate a reference signal used to sense data in the data memory. The reference signal can track the PVT conditions of the memory cells in the data memory, enabling better sensing margins for high density memory, including high density 3D flash memory.

A memory device is described that includes a data memory and a reference memory, with conversion circuitry that converts signals from a group of memory cells in the reference memory into a reference signal. The reference signal is applied to a sense amplifier to sense data stored in a selected memory cell in the data memory.

The data memory and the reference memory can comprise matching 3D memory structures in which the combination of signals from the group of memory cells in the reference memory can track the PVT characteristics of memory cells in the data memory.

Also, a memory device is described that includes a data memory and a reference memory, with conversion circuitry that converts signals from the first group of memory cells in the reference memory to produce a first reference signal, and from a second group of memory cells in the reference memory to produce a second reference signal. One of the first and second reference signals is selected based on the region in the data memory being accessed for a read, and applied to sense amplifiers to sense data stored in a selected memory cell in the data memory.

A variety of embodiments of a reference memory are described. In one example, the reference memory comprises a plurality of memory cells, including inactive memory cells and an active group of memory cells. The active group of memory cells is connected to local reference bit lines and to a reference word line in the reference memory. Conversion circuitry combines signals on the local reference bit lines from the active group of memory cells to produce a reference signal.

The reference memory as described herein can comprise a stack structure having a plurality of slices, where each slice includes a stack of horizontal word lines in respective levels of the stack and a set of vertical conductors. Memory cells have horizontal channels between adjacent vertical conductors at the levels of the horizontal word lines to the stack. A group of memory cells is disposed in one of the slices of the plurality of slices, and used for generation of a reference signal as mentioned above. The stack of horizontal word lines includes a reference word line for the group of memory cells. A reference word line driver applies a word line reference voltage to the reference word line, and applies deselect voltages to other word lines in the reference memory. The vertical conductors for the memory cells in the group are connected to local reference bit lines which can overlie the stack. The local reference bit lines connect to conversion circuitry to produce the reference signal.

Embodiments are described in which a first group of memory cells in the reference memory is disposed in one word line level of a slice, and a second group of memory cells in the reference memory is disposed on a second word line level in the slice. Embodiments are described in which a first group of memory cells in the reference memory is disposed in one of the slices, and a second group of memory cells in the reference memory is disposed in another of the slices.

Embodiments of the conversion circuitry can include a summing node at which current from the memory cells in the group of memory cells in the reference memory are summed to produce a summed current. The summed current can be applied to a current mirror circuit which mirrors the summed current dividing it to a target current level of a reference current. The reference current can be applied to a current voltage converter to produce a reference signal as an input to a voltage comparator in the sense amplifier.

Other aspects and advantages of the present technology can be seen on review of the drawings, the detailed description and the claims, which follow.

BRIEF DESCRIPTION OF THE DRAWINGS

FIG. 3 is a cross-section in an X-Y plane of the pillars and a slice of the structure of FIG. 2.

FIG. 4 is a cross-section on line A-A' of FIG. 3.

FIG. 5 is a cross-section on line B-B' of FIG. 3.

FIG. 6 is a circuit schematic diagram of portions of the memory structure of FIG. 2.

FIG. 7 is a schematic circuit diagram showing a slice of the memory structure of FIG. 2.

FIG. 8 is a perspective view illustrating a 3D arrangement of a memory structure like that of FIG. 2.

DETAILED DESCRIPTION

A detailed description of embodiments of the present technology is provided with reference to the FIGS. 1-24.

Figure 1:
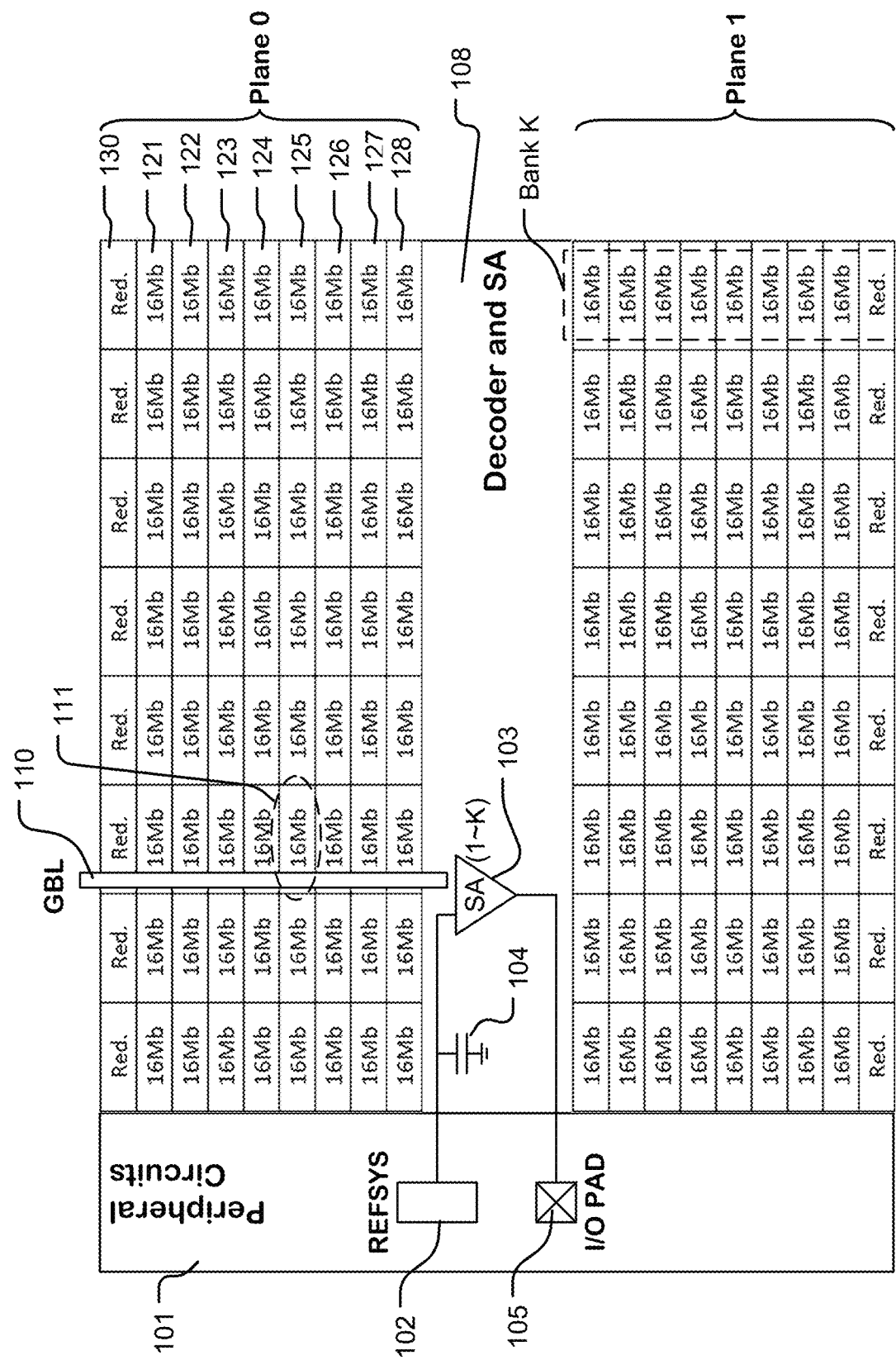
FIG. 1 is a layout view of an integrated circuit device including a data memory and a reference memory.

FIG. 1 is a layout view of an integrated circuit device including a data memory and a reference memory. The integrated circuit memory device in layout has a data memory region having two planes in this example, Plane 0 and Plane 1. The planes comprise respective arrays of tiles (e.g. tile 111). In some embodiments, the tiles comprise 3D, multilevel structures, examples of which are described in more detail below.

The tiles are arranged in rows, e.g. rows 121 through 128 in Plane 0. Columns of tiles in each plane are referred to as banks, such as Bank K in the Plane 1. In this example, each blank includes a redundant tile (e.g. tile 130) used for memory redundancy operations. In this figure, each tile is labeled 16 Mb, suggesting that each tile includes memory cells sufficient to store 16 Megabits of data. In this example, two planes each including 64 tiles, with each tile including 16 Mb of cells, provide a memory having a capacity of 2 Gigabits. Of course, other tile sizes and other plane sizes can be implemented. Embodiments of memory devices can for example have capacity on the order of Terabits.

Between Plane 0 and Plane 1 there is a first peripheral region 108 which includes peripheral circuits supporting operation of the memory. Also, a second peripheral region 101 to the left of Plane 0 and Plane 1 also includes peripheral circuits supporting operation of the memory.

As illustrated schematically, first peripheral region 108 includes sense circuits including a plurality of sense amplifier circuits (e.g. 103) which are connected to respective banks in Plane 0 and Plane 1. A global bit line 110, also referred to as a data bit line, is illustrated over the bank of Plane 0 that includes tile 111 and extends to corresponding sense amplifier circuit 103. A plurality of global bit lines (not shown) can be implemented over each bank of tiles, which enables sensing a plurality of memory cells in parallel from selected tiles.

As indicated, the plurality of sense amplifier circuits includes sense amplifier circuits SA(1) to SA(K), one for each bank in Plane 0 and Plane 1. Each sense amplifier circuit can include one sense amplifier for each global bit line in the bank.

In this layout, the second peripheral region 101 includes other peripheral circuits including input/output drivers (not shown), coupled to an input/output pad 105, and a reference system 102.

In some embodiments, the reference system 102 includes a reference memory comprising a 3D, multilevel structure matching tiles in the data memory. The reference system 102 generates a signal or signals by biasing a group of memory cells. This signal or signals is/are converted in conversion circuitry located in the first or second peripheral regions, to a reference signal used as a reference in the sense amplifier circuits (e.g. 103) for sensing data in the data memory. The signal path from the reference system 102 to sense amplifier circuits can have a different capacitance than the signal path including the global bit lines, from selected tiles in the data memory to the sense amplifier circuits. Thus, a compensation capacitor 104 is included on the signal path of the reference signal. In one embodiment, the compensation capacitor 104 can comprise a dummy global bit line having a structure that matches the structure of the global bit lines for the purposes of capacitance matching. In embodiments in which a group of the sense amplifiers including some or all of the sense amplifiers for a given plane share a reference current generator, the compensation capacitor 104 can be shared, and there can be one dummy global bit line per group for the compensation capacitor 104, disposed in given plane. In another embodiment, in which there are individual reference current generators for each bank and each sense amplifier, the compensation capacitor 104 can be individual for each bank, and there can be one dummy global bit line per bank. Other capacitor structures in sized appropriately for capacitance matching, can be utilized to save area, including MOS capacitors (MOS transistor structures having source and drain connected together at one node and a gate forming another node to form capacitor terminals), metal insulator metal MIM capacitors (including terminals formed in patterned conductor layers separated by interlayer dielectrics or inter-metal dielectrics), and various types of junction capacitors. In one example, the compensation capacitor 104 can comprise a MOS capacitor with a relatively thin gate dielectric, enabling substantial area savings.

Embodiments of the technology are described herein, with reference to an integrated circuit memory having a layout like that of FIG. 1. Of course, other layout arrangements can be utilized the suit particular embodiments.

The sense circuitry can distinguish high/low threshold voltage states in the data memory by comparing the reference cell current with target cell current. Multiple memory cells in the reference memory can be connected together by a conversion circuit, by connecting local reference bit lines together on a common reference bit line, for example, to average noise and improve sensing margins. The multiple cells in the reference memory can be configured for program, erase and read together. A threshold trimming scheme can be used in programming the memory cells in the reference memory to approach the reference cell at a level that is a factor higher than the target sensing current, and then it can be reduced by the factor using a current mirror circuit or other conversion circuit that will preserve the PVT conditions in the reference memory. Also, the reference memory can use a smaller WL bias (e.g., 5.5V) during a read of the data memory, but the same global bit line bias (e.g., 1.8V), as the array.

For reference memory, a small array area (X/Y: 20 um~30 um) for process uniformity can be used to implement a mini-array using the same process technology as used to form the data memory.

The reference system can be located at the peripheral region on a memory device, preserving array uniformity for the data memory. On the other hand, the capacitance loading can be much heavier for memory cells in the data memory, than for memory cells of reference memory. In order to balance the capacitance loading between reference signal path and data signal path, a similar capacitance loading (e.g., MOS capacitor or MIM capacitor) can be added to the reference signal path.

We can introduce more than one reference signal to cover deviated cells (e.g., edge WL cells). Moreover, in order to gain sensing margin, we can sum different numbers of cells in the different groups or adopt a different VREF for different groups.

FIG. 1 is an example of a memory, comprising a data memory comprising a 3D arrangement of memory cells including one or more data memory banks. Each data memory bank includes a distinct set of global bit lines having at least one member, and a plurality of distinct tiles. Each distinct tile in the plurality of distinct tiles of each data memory bank includes a plurality of local bit lines and a plurality of word lines coupled to the memory cells of the distinct tile, and bit line transistors configured to connect the plurality of local bit lines of the distinct tile to corresponding global bit lines in the distinct set of global bit lines for the data memory bank. The memory also includes a reference memory comprising a 3D arrangement of memory cells. The reference memory includes a plurality of local reference bit lines and a plurality of word lines coupled to the memory cells of the reference memory, and bit line transistors configured to connect the plurality of local reference bit lines to a reference bit line for the reference memory. The memory includes conversion circuitry to convert signals on the reference bit line into a reference signal. One or more distinct sets of sense amplifiers is included. Each distinct set is coupled to the distinct set of global bit lines of a corresponding data memory bank of the one or more data memory banks and to the conversion circuitry, to sense data stored in selected memory cells in the corresponding data memory bank in response to comparison of memory array signals on the distinct set of global bit lines and the reference signal.

Figure 2:
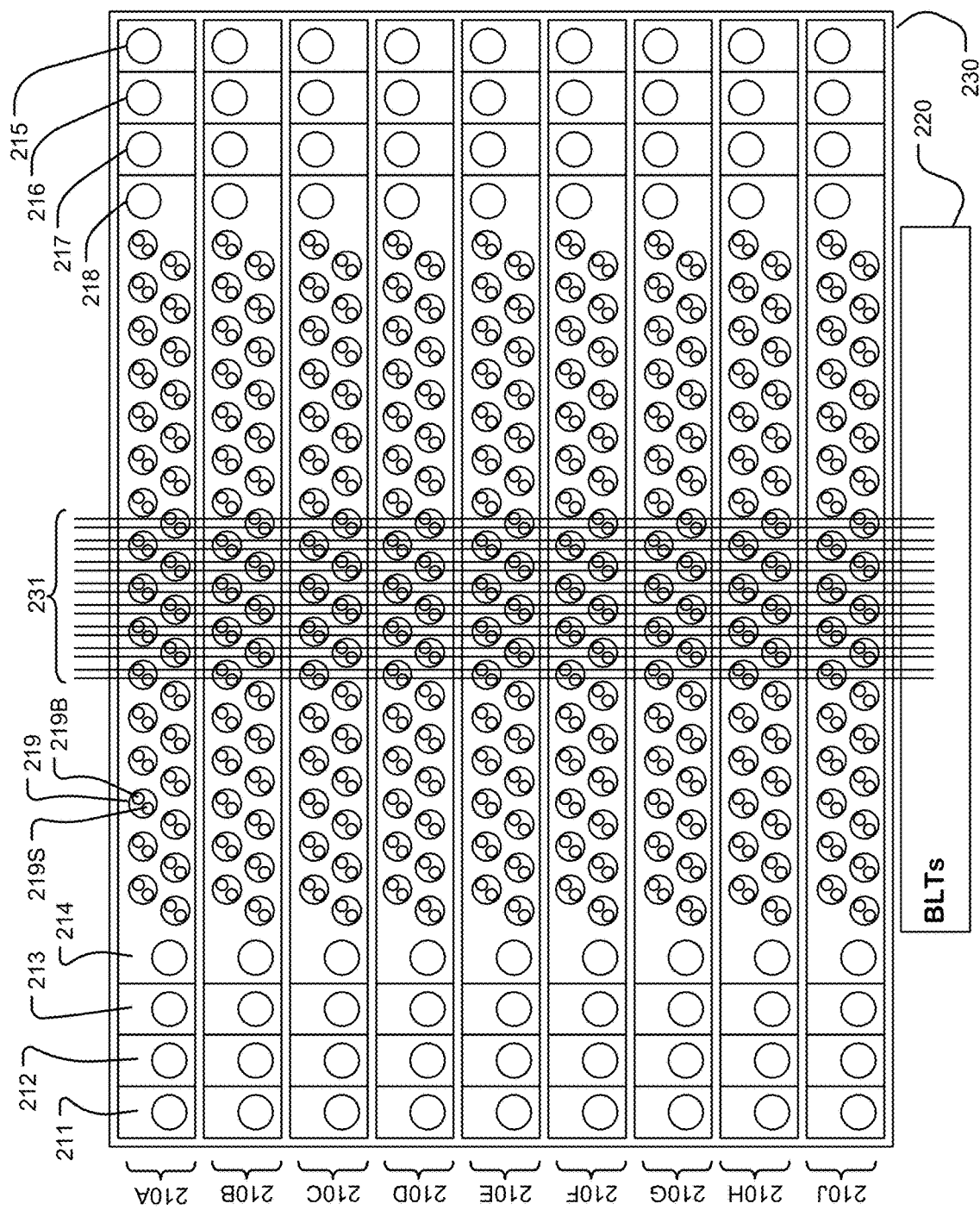
FIG. 2 is a plan view of a 3D memory architecture which can be used to implement a tile such as that shown in FIG. 1.

FIG. 2 illustrates a plan view of an example of a tile implemented by a 3D, multilevel structure including memory cells of a data memory, which can be used in a device like that of FIG. 1. The tile includes a stack structure 230, and a bit line transistor structure 220.

In this embodiment, the stack structure 230 comprises a plurality of slices 210A to 210I. Each slice includes a set of horizontal word lines (e.g. 211, 212, 213, 214 for slice 210A) in respective levels of stack. To simplify the drawing, only four levels are illustrated. Each slice includes a plurality of pillars (e.g. 219) which extend through the horizontal word lines of the slice in the stack structure, in this embodiment.

Each pillar comprises insulating fill having a vertical conductor 219S configured as a local source line, and a vertical conductor 219B configured as a local bit line. Although not shown, a semiconductor channel material surrounds the insulating fill of the pillars to provide channels for the memory cells at the levels of the horizontal word lines extending between the vertical conductor configured as a local bit line, and the vertical conductor configured as a local source line. An expanded view of the pillars is illustrated in FIGS. 3 to 5. A description of a 3D memory like that of FIG. 2 is provided in commonly owned U.S. patent application Ser. No. 17/170,542, entitled CURVED CHANNEL MEMORY DEVICE, filed Feb. 8, 2021, which is incorporated by reference as if fully set forth herein.

Each slice includes a set of vertical conductors configured for local bit lines and a set of vertical conductors configured for local source lines. In this example, each slice includes two offset rows of pillars. Overlying the stack structures in a patterned conductor layer are the plurality of local bit line and source line conductors 231 (shown over only a subset of the pillars in each slice in this illustration, although local bit line and source line conductors overlie all of the pillars used as memory). The local bit line conductors 231 in the set extend to the bit line transistor structure 220, where they are connected through bit line select transistors to global bit lines, which overlie all the tiles in the bank as discussed above. In this configuration, a local bit line conductor is connected to one vertical conductor arranged as a local bit line conductor, in each slice of the tile. Likewise, the source line conductors 231 in the set are connected through source select transistors (not shown) to source-side bias circuitry.

The horizontal word lines are connected in a stairstep structure on each side of the stack structure to corresponding word line drivers through contacts (e.g. 215-218) in this example.

FIG. 3 is an expanded view of four pillars 330, 331, 332, 333 for the stack structure of a slice like that of FIG. 2. A horizontal word line 311 in the stack surrounds the pillars 330-333. The pillars each comprise an insulating fill surrounded by a semiconductor channel material (e.g. 323). A data storage structure (e.g. 322) surrounds the semiconductor channel material. The data storage structure can be a dielectric charge trapping structure, which includes a plurality of dielectrics, including one or more layers configured as a tunneling layer, one or more layers configured as a charge trapping layer, and one or more layers configured as a blocking layer.

FIG. 4 is a cross-section taken on the line A-A' of FIG. 2.
FIG. 5 is a cross-section taken on the line B-B' of FIG. 2.
In FIG. 4, horizontal word line 311 is disposed at word line level 5. The pillar 333 includes an insulating core with vertical conductors 320, 321 contacting the semiconductor channel material 323 (not shown) to form source/drain terminals for the memory cells at each word line level. In FIG. 5, the cross-section does not cross vertical conductors. It illustrates the insulating fill surrounded by a semiconductor channel material 323. Also, the data storage structure 322 is disposed between the semiconductor channel material and the word lines.

FIG. 6 is a circuit schematic representation of a portion of a data memory like that of FIG. 2, showing a portion of two slices and two word line levels. The vertical conductors configured as local source lines (e.g. 650) and local bit lines (e.g. 651) extend vertically through the stack structure. Memory cells (e.g. 660) extend between the vertical conductors configured as local source lines, and vertical conductors configured as local bit lines. A first slice at index "y" includes word lines WL (y, z) and WL (y, z+1). A second slice "y+1" includes word lines WL(y+1, z) and WL (y+1, z+1), where the word line levels are represented by the index "z" and the slice location in the tile is represented by the index "y". The locations of the individual local bit lines along the row in the slice, would be represented by the index "x" in an XYZ coordinate. In this example, local bit lines LBL(1) for x=1, and LBL(2) for x=2, and local source lines LSL(1) and LSL(2) are illustrated for two stacks of cells, in each of two slices.

FIG. 7 provides a perspective schematic view of a slice 701. The slice 701 includes a stack of horizontal word lines 702. A set of conductors configured as local bit lines (e.g. 721) and a set of conductors configured as local source lines (e.g. 741) are disposed over this slice and connect to the corresponding vertical conductors. The set of local source lines is connected to source line transistors 740 to connect local source lines to a source side bias circuit, represented by the ground symbol 745, and which can include a common source line. In some embodiments, the source side bias circuit can provide voltages other than ground. The set of local bit lines is connected to a set of bit line transistors 720. The set of bit line transistors 720 connects the local bit lines to corresponding global bit lines 780 by intermediate conductors 760, in this example. Different local bit lines in the slice can be biased at different levels depending on the operation, and thereby connect to independent global bit lines. In some embodiments, a plurality of local bit lines share a single global bit line, and are connected one at a time to the corresponding local bit line as a result of column decoding on the bit line transistors.

The embodiments of FIGS. 3 to 7 can implement NOR-architecture and AND-architecture flash memory devices, with separate local source lines and local bit lines for each stack of cells. Alternative embodiments include virtual ground NOR-architecture and AND-architecture memory devices in which the vertical conductors can be shared between adjacent stacks of cells, and configured for operation as both local bit lines (or local reference bit lines in the reference memory) and local source lines (or local reference source lines in the reference memory. A description of virtual ground NOR-architecture and AND-architecture structures is provided in our commonly owned, U.S. patent application Ser. No. 17/170,542, entitled CURVED CHANNEL 3D MEMORY DEVICE, filed 8 Feb. 2021, (MXIC 2314-1) and U.S. patent application Ser. No. 17/230,114, entitled 3D VIRTUAL GROUND MEMORY AND MANUFACTURING METHODS FOR SAME, filed 14 Apr. 2021, (MXIC 2318-1) which are incorporated by reference as if fully set forth herein.

Embodiments of a memory are described herein including a memory integrated circuit comprising a plurality of tiles arranged in banks, and banks arranged in planes. Each distinct tile in the data memory comprises a plurality of slices, and each slice in the plurality of slices comprises a stack of alternating layers of insulator material and word line material, the layers of word line material configured as word lines in the plurality of word lines; a plurality of vertical conductors separated by insulating pillars disposed through stacks configured as local bit lines in the plurality of local bit lines; data storage structures disposed on inside surfaces of the layers of word line material at cross-points of the insulating pillars and the layers of word line material; and semiconductor channel material between the insulating pillars and the data storage structures at cross-points of the insulating pillars with the layers of word line material, the semiconductor channel material forming a conduction path of the memory cells between source/drain terminals in adjacent vertical conductors. Also, the memory includes a reference array comprising a plurality of reference slices, and each reference slice in the plurality of reference slices comprises a stack of alternating layers of insulator material and word line material, the layers of word line material configured as reference word lines in the plurality of reference word lines; a plurality of vertical conductors separated by insulating pillars disposed through stacks configured as the plurality of local reference bit lines; data storage structures disposed on inside surfaces of the layers of word line material at cross-points of the insulating pillars and the layers of word line material; and semiconductor channel material between the insulating pillars and the data storage structures at cross-points of the insulating pillars with the layers of word line material, the semiconductor channel material forming a conduction path of the memory cells between source/drain terminals in adjacent vertical conductors.

Embodiments of a memory are described herein including a memory integrated circuit comprising a plurality of tiles arranged in banks, and banks arranged in planes. Each distinct tile in the data memory comprises a plurality of slices, and each slice in the plurality of slices comprises a stack of alternating layers of insulator material and word line material with a plurality of vertical pillars through the alternating layers, some or all of the layers of word line material configured as word lines in the plurality of word lines; in which each vertical pillar in the plurality of vertical pillars includes a first vertical conductor, a second conductive pillar separated from the first conductive pillar by an insulator, the first vertical conductors in the plurality of pillars configured as local bit lines in the plurality of local reference bit lines, the second vertical conductors in the plurality of vertical pillars configured as local source lines, data storage structures disposed on inside surfaces of the layers of word line material at cross-points of the vertical pillars and the layers of word line material, and semiconductor channel material between the insulator and the data storage structures at cross-points of the vertical pillars with the layers of word line material, the semiconductor channel material forming a conduction path of the memory cells between source/drain terminals in the first and second vertical conductors in the vertical pillar. Also the reference array comprises a plurality of reference slices, and each reference slice in the plurality of reference slices comprises a stack of alternating layers of insulator material and word line material with a plurality of vertical pillars through the alternating layers, one or more of the layers of word line material configured as a reference word line in the plurality of reference word lines; in which each vertical pillar in the plurality of vertical pillars includes a first vertical conductor, a second conductive pillar separated from the first conductive pillar by an insulator, the first vertical conductors in the plurality of pillars configured as local reference bit lines in the plurality of local reference bit lines, the second vertical conductors in the plurality of vertical pillars configured as local source lines, data storage structures disposed on inside surfaces of the layers of word line material at cross-points of the vertical pillars and the layers of word line material, and semiconductor channel material between the insulator and the data storage structures at cross-points of the vertical pillars with the layers of word line material, the semiconductor channel material forming a conduction path of the memory cells between source/drain terminals in the first and second vertical conductors in the vertical pillar.

FIG. 8 illustrates a 3D arrangement of the local bit lines 830, and global bit lines 880 over the stack structure 801 of a tile in different patterned conductor layers. In this illustration, the local bit lines 830 are disposed in a patterned conductor layer overlying the stack structure. The global bit lines 880 are disposed in a patterned conductor layer overlying the local bit lines 830. The global bit lines 880 may have a larger pitch in the x-direction than the local bit lines. So, for example, a group of four local bit lines 830 may share a single global bit line. The bit line transistors operate to select a current local bit line for a particular addressed cell from a group of local bit lines. Vertical conductors (not shown) are disposed through the stack structure and connect to corresponding local bit lines 830 as discussed above. A local bit lines 830 extend to a region adjacent the stack structure in the tile and connect by the plug 855 or other interlayer connector, to bit line transistors 820 on the substrate. The bit line transistors connect the local bit lines of selected tiles to global bit lines (e.g. 880) by the plug 860, or other interlayer connector. The global bit lines 880 extend across the tiles to the sense amplifier in peripheral circuit region 810 for the bank, and connect via plug 881, or other interlayer connector structure. The word line decoder 811 in this example is disposed under the stack structure using a technology such as CMOS under the array.

Figure 9:
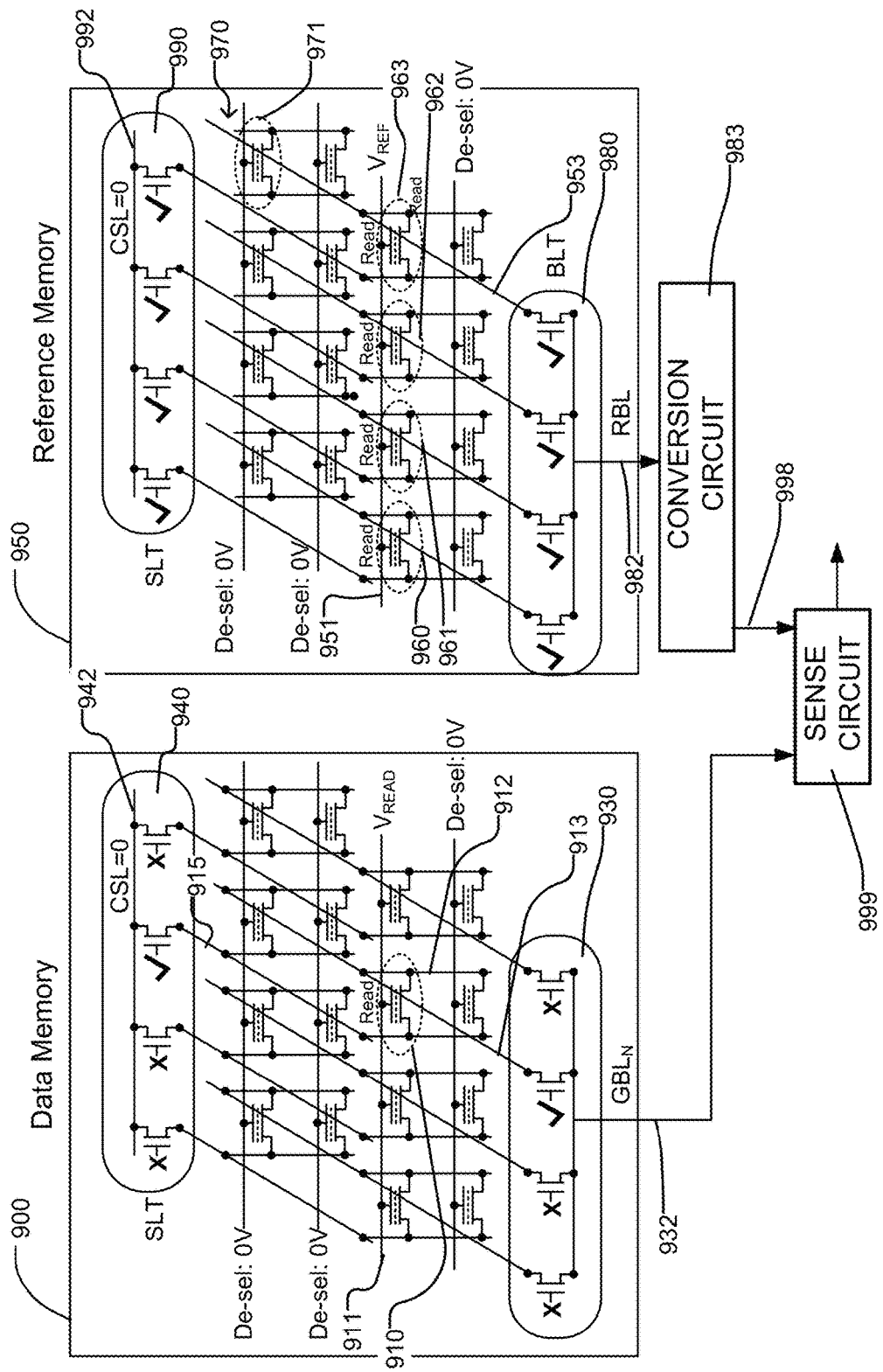
FIG. 9 is a circuit schematic illustrating the data memory and a reference memory such as can be used in a device like that of FIG. 2.

FIG. 9 is a schematic illustration of a memory device including a data memory 900 and a reference memory 950, such as that of FIG. 1. The data memory 900 is illustrated in the schematic format of FIG. 6. The data memory includes source select transistors 940 which connect local source lines to a common source line 942. Also, the data memory includes bit line transistors 930 which connect selected ones of the local bit lines (e.g. 913) to global bit lines 932. The bit line transistors 930 are decoded as indicated by the checkmark on the selected local bit line, and the "X" mark on the unselected local bit lines to select one local bit line at a time. A bias arrangement for a read operation for a selected cell 910 is illustrated. The selected cell 910 is disposed on horizontal word line 911 and on local bit line 913, which is connected to the selected cell 910 by a vertical conductor 912. In this embodiment, the source line transistors 940 are also decoded, selecting the local source line 915, while disconnecting the other local source lines. The word line 951 receives a bias voltage $V_{READ}$, the local source line 915 connected to the common source line 942 receives a reference voltage of 0 V, and the local bit line 913 is connected through the bit line transistors 930 to the global bit line 932 which is biased in the sensing circuit 999, at bit line read voltage.

The reference memory 950 has the same schematic structure. The reference memory 950 includes source select transistors 990 which connect local reference source lines to a common source line 992. Also, the reference memory 950 includes bit line transistors 980 which connect selected ones of the local reference bit lines (e.g. 953) to reference bit lines 922.

Reference memory is configured so that its PVT characteristics match those of the data memory. Thus, the reference memory can have the same three-dimensional arrangement as the data memory, and can be manufactured using the same manufacturing process. In some embodiments, the memory cells in the reference memory have the same dimensions as the memory cells in the data memory. In some embodiments, memory cells in the reference memory are both manufactured using the same manufacturing process, and have the same dimensions as memory cells in the data memory.

In this example, the reference memory is biased to select a group of memory cells to be used for generation of a reference signal on line 998 by the sense circuitry 999. In a read operation, the horizontal word line 951 receives a reference voltage $V_{REF}$ which can be different from the read voltage $V_{READ}$ applied and the data memory. Unselected word lines in the same slice, and unselected word lines in unselected slices, can be biased to a common de-select voltage, such as ground.

The memory cells 960, 961, 962, 963 on local reference bit lines (e.g. 953) are coupled to the bit line transistors 980, all of which are turned on to couple the group of local reference bit lines for all the memory cells 960-963 in the group to a common reference bit line 982. Also, the local reference source lines for the memory cells 960, 961, 962, 963 are coupled to source line transistors 990, all of which are turned on to couple the group of local reference source lines to the common reference source line 992. During the read operation, the common reference bit line 982 and the common reference source line 992 can be biased at the same voltages as the global bit lines in the data memory. The currents on the local reference bit lines are summed at a summing node of the bit line transistors 980 is this embodiment, and applied to the reference bit line 982, which is connected to other portions of conversion circuit 983. This summing node can be considered part of the conversion circuit. The summed current is converted in the conversion circuit 983 to a reference signal on line 998, which is applied to the sense circuitry 999. The reference signal on line 998 can be compared in the sense circuit with the signal on the global bit line 932 to indicate the data stored in the selected memory cell in the data memory 900.

In unselected slices of the reference memory 950, the vertical conductors can be disconnected from the local reference bit lines, as indicated at 970 which disconnects the memory cell 971 from the local reference bit line 953. This can be accomplished statically for vertical conductors below the local reference bit lines, by omitting a vertical connection between the vertical conductors in the stack structure and the overlying patterned metal layer in which the local bit lines are disposed. Also, this can be accomplished by omitting the local reference bit lines from the stack structure not including the group of memory cells to be utilized.

In this example, a group of four memory cells in a statically selected layer of a statically selected slice of the reference memory is utilized to produce the reference signal for any memory cell in the memory array. The number of memory cells in the group can vary as suits a particular embodiment, but it is found that a group of four can provide good characteristics for the reference signal for sensing memory cells across all or most of the data memory in a 3D arrangement.

Figure 10:
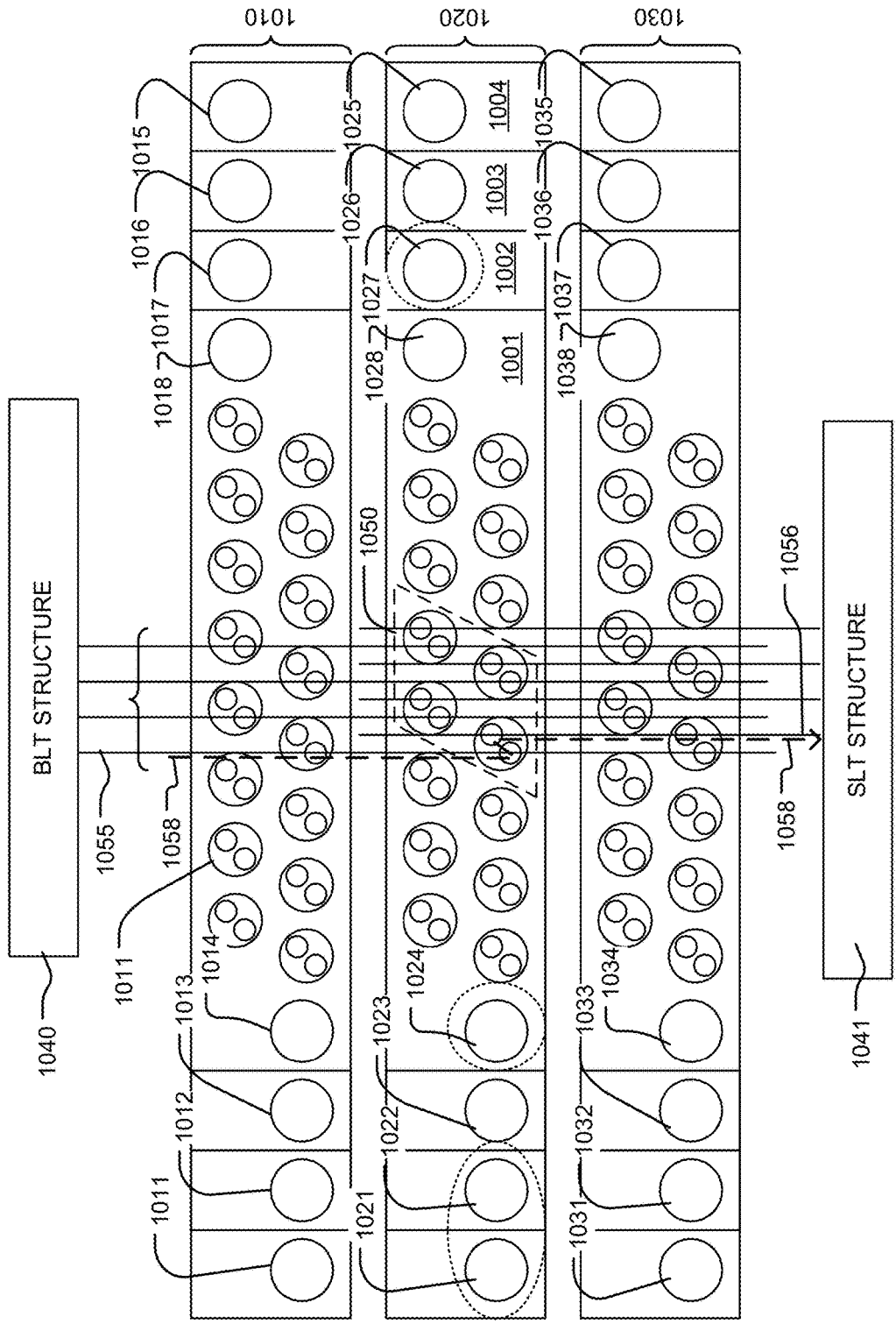
FIG. 10 is a plan view of a 3D memory architecture which can be used to implement a reference memory for the reference system of a device like that of FIG. 1.

FIG. 10 illustrates a plan view of an example 3D arrangement of memory cells for a reference memory which can be used in a device like that of FIG. 1 utilizing tiles like that of FIG. 2. The reference memory includes a stack structure including three slices 1010, 1020, 1030, in this example, and a bit line transistor structure 1080. The structure can be configured as illustrated above with respect to FIG. 8. Also, a source line transistor structure 1081 is included. The source line transistor structure 1081 can be disposed on the same side as the bit line transistor structure 1080, or on opposing sides as illustrated.

Each slice 1010, 1020, 1030 includes a stack of horizontal word lines. Slice 1020 for example includes horizontal word lines 1001, 1002, 1003, 1004 in four corresponding word line levels. The number of word line levels can be the same as the number of word line levels implemented in the data memory.

Each slice 1010, 1020, 1030 includes a plurality of pillars (e.g. pillar 1011), which extend through the stack structure of the slice. As in the structure of FIG. 2, each pillar comprises a vertical conductor configured as a local source line, and a vertical conductor configured as local bit line. Semiconductor channel material surrounds insulating fill of the pillars to provide channels for memory cells at the levels of the horizontal word lines, and extends between the vertical conductor configured as a local bit line, and the vertical conductor configured as a local source line. The reference memory can be implemented in the same manner as the data memory as discussed above.

As in the data memory, each slice includes two offset rows of pillars. Overlying the stack structures in a pattern conductor layer are a plurality of local reference bit lines (e.g. 1055) and local reference source lines (e.g. 1056). The local reference bit lines extend to the bit line transistor structure 1040 for connection to conversion circuitry as discussed above. Local reference source lines extend to a source line transistor structure 1041 for connection to a source side bias circuit, which may include a common source line.

In the reference memory, a group 1050 of memory cells is utilized for generation of a reference signal. In this example, the group 1050 is disposed in slice 1020 on the horizontal word line 1002. The group 1050 is used in combination for generation of the reference signal, and can be a statically selected group, which is biased automatically when the group is selected for use as a reference cell. The group can be statically selected by connecting unselected word lines by their contacts to a deselect bias voltage such as ground. In this example, the contacts 1021, 1022, 1024 (and optionally contacts 1028, 1026, 1025) in the slice 1020 are connected to a deselect bias voltage. Contact 1027 (and optionally contact 1023) is connected to the reference word line voltage driver to receive a voltage $V_{REF}$ during a read operation for the data memory.

A current flow through a memory cell is illustrated in FIG. 10. The current flow 1058 for a reference memory cell of the group 1050 flows along the local reference bit line 1055 to a vertical conductor configured for a local bit line, to the memory cell of the level of word line 1002, across the memory cell, to a vertical conductor configured as a local source line, and up to the local reference source line 1056. This current flows along the local reference source line 1056 to the source line transistor structure 1081. In this case, there are four pillars in the group 1050, and currents from four memory cells on the level of word line 1002 are summed in the bit line structure as discussed above.

In the unselected slices 1010, 1030, vertical connectors between the vertical conductors in the pillars and the overlying local reference source lines and local reference bit lines are omitted in this example. Likewise, the word line driver circuits that apply the bias voltage for the selected slice 1020 can be disconnected from the contacts 1031-1034 and 1035-1038 in slice 1030, and can be disconnected from contacts 1011-1014 and 1015-1018 in slice 1010. Other techniques to disconnect the unselected slices can be used as well.

In this example, there are three slices in the reference memory stack structure. The first and third slices are dummy slices disconnected from the circuitry used to generate the reference signal. Slice 1020, the active slice, is disposed between the first and third slices. By disposing the active slice 1020 between dummy slices, the PVT characteristics of the active slice can match those of the data memory over a greater range of conditions.

In some embodiments, there may be more than three slices in the reference memory stack structure. For example, in some embodiments there may be five slices.

Figure 10A:
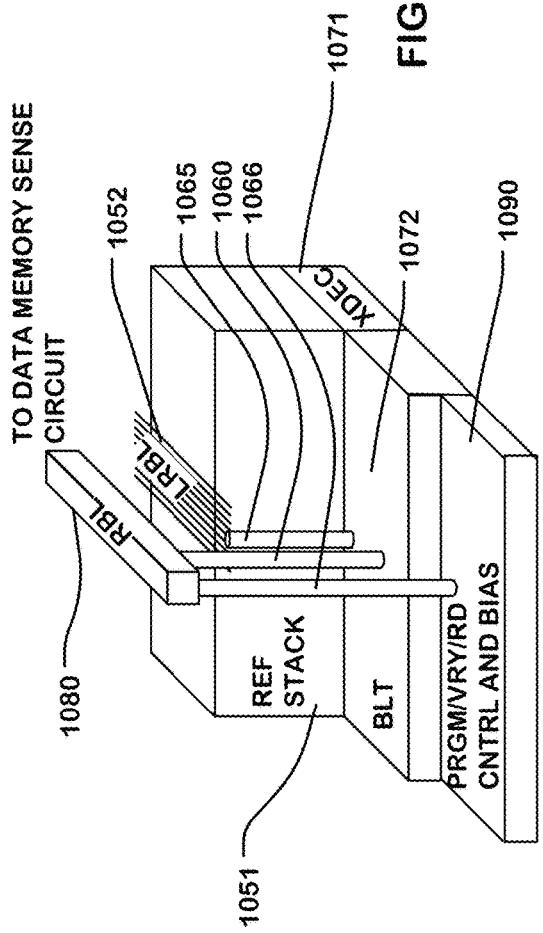
FIG. 10A is a perspective view illustrating a 3D arrangement of a reference memory structure like that of FIG. 10.

FIG. 10A illustrates a 3D arrangement of the local reference bit lines 1052, and global reference bit line 1080 over the stack structure 1051 of a reference memory stack structure like that of FIG. 10. In this illustration, the local reference bit lines 1052 are disposed in a patterned conductor layer overlying the stack structure. The reference bit line 1080 is disposed in a patterned conductor layer overlying the local reference bit lines 1052. The bit line transistors operate to connect the group of local reference bit lines 1052 for a group of memory cells to the reference bit line 1080. Vertical conductors (not shown) are disposed through the stack structure and connect to corresponding local reference bit lines 1052 as discussed above. The local reference bit lines 1052 extend to a region adjacent the stack structure 1001 and connects by the plug 1065 or other interlayer connector, to bit line transistors 1072 on the substrate. The bit line transistors 1072 connect the local reference bit lines to the reference bit line 1080 of the conversion circuit by the plug 1060, or other interlayer connector. The reference bit line 1080 extends across the stack structure in this example to a region on the device including other components of the conversion circuit. This region can be adjacent the sense amplifier circuitry for the data memory. Also, the reference bit line 1080 connects via plug 1066 to reference memory peripheral circuits 1090 on the substrate, including control and bias circuits for program and program verify operations used to set the threshold states of the memory cells in the reference memory, and used during read operations for the data memory. In some embodiments, the threshold voltage trim operation for the reference memory can be controlled by a wafer sort tool in the manufacturing plant. The control and bias circuits can execute the process described below with reference to FIG. 24, to set and trim the threshold voltages of the memory cells in the reference memory.

Some or all of the word line drivers (XDEC) 1071 for the reference memory can be disposed under the stack structure using a technology such as CMOS under the array.

In the embodiment of FIG. 10A, the reference memory stack structure matches the structure of tiles in the data memory, with respect to the arrangement of the bit line transistors and word line driver. In some embodiments, other arrangements for these components can be used.

Figure 11:
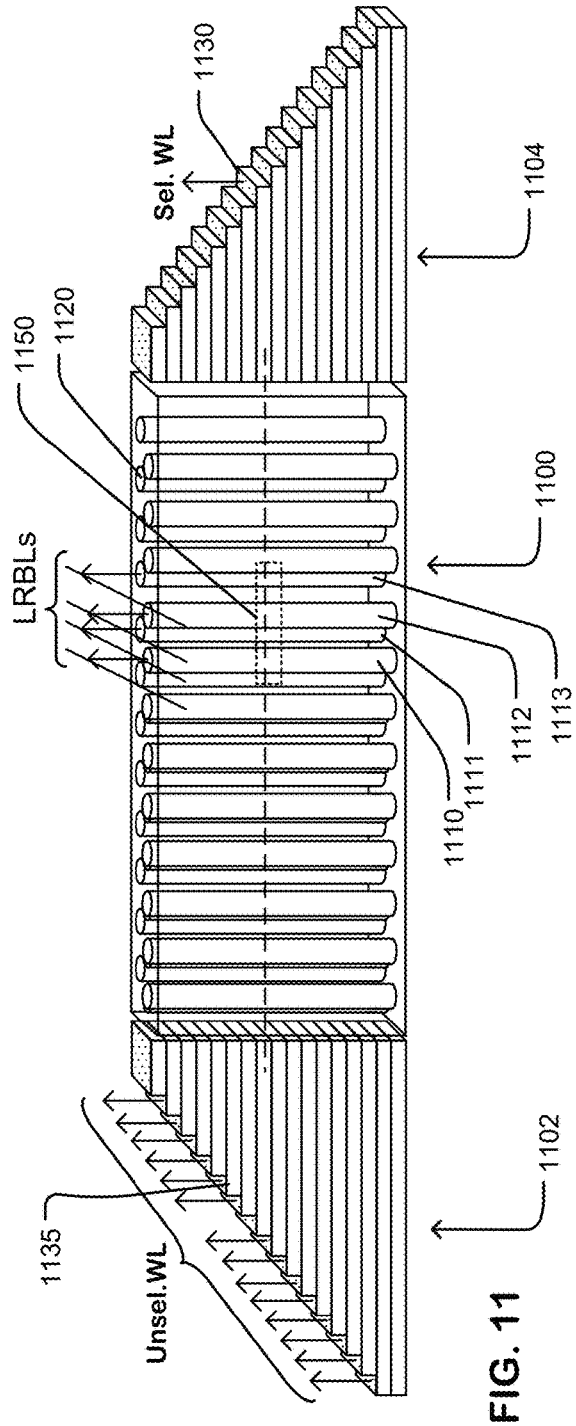
FIG. 11 is a perspective view of a slice of a memory structure like that of FIG. 10 including a group of memory cells used for generation of the reference signal.

FIG. 11 is a perspective view of a slice in the reference stack for the reference memory. The slice includes stairstep contact structures 1102 and 1104 on opposing ends, and a pillar region 1100. The horizontal word lines are not shown in the pillar regions for the purposes of this figure. The slice includes a plurality of pillars (e.g. pillar 1120), arranged in two offset rows as described with reference to FIG. 10. A group of memory cells (in location 1150) on pillars 1110, 1111, 1112, 1113 at the level of the selected word line 1130 is configured for generating the reference signal. The pillars 1110, 1111, 1112, 1113 are connected to respective local reference bit lines LRBLs, while the other pillars in the slice are not connected to local reference bit lines in this example. The local reference source lines are not shown in this illustration.

The selected word line 1130 is connected to a word line driver or other bias circuit, applying $V_{REF}$. The unselected word lines (e.g. 1135) are connected to a word line driver or other bias circuit applying a deselect voltage such as ground. In this example, all word lines except the selected word line 1130, are unselected word lines while the reference signal is being generated using the group of cells on the selected word line.

Figure 12:
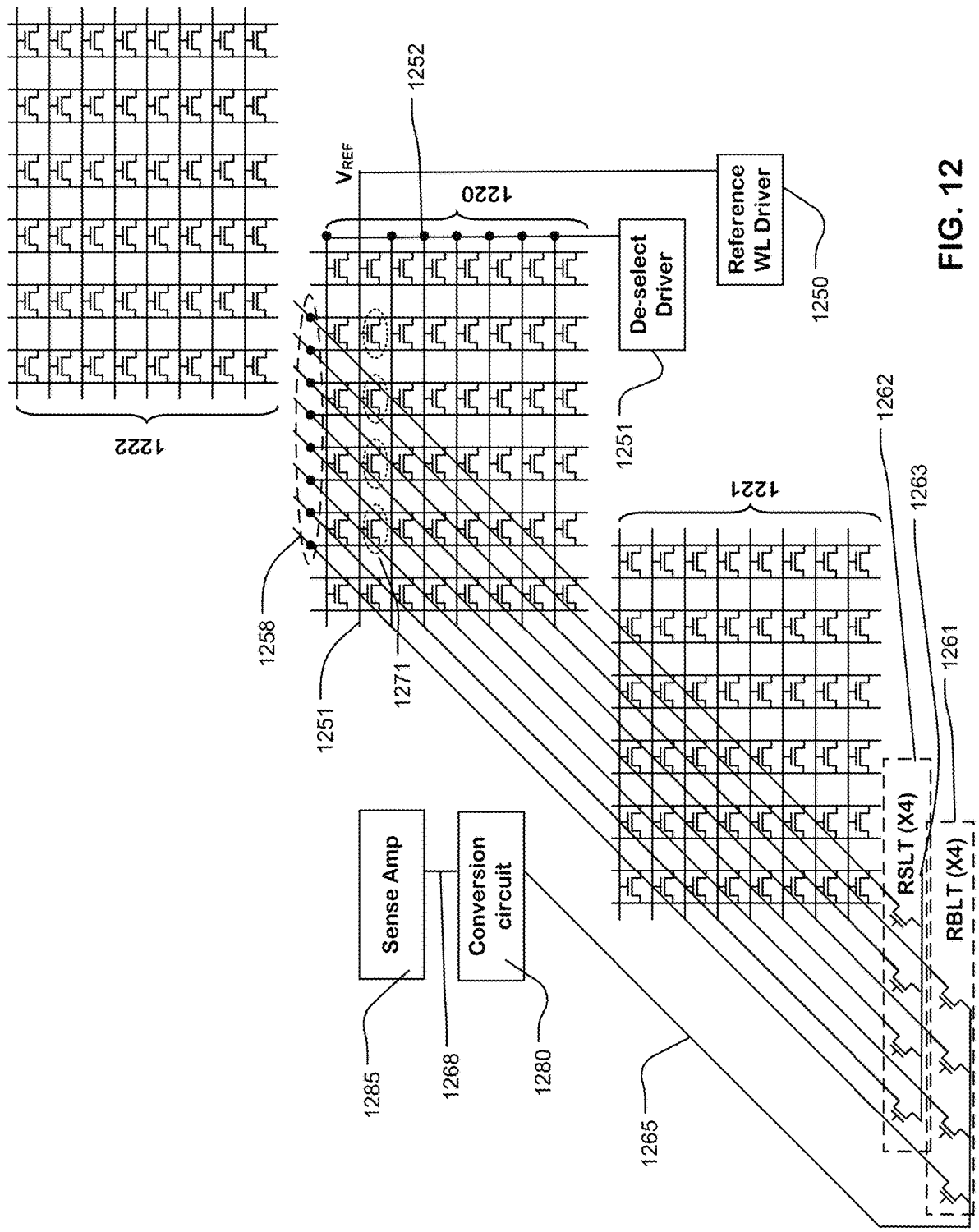
FIG. 12 is a schematic diagram of a reference memory like that of FIG. 10.

FIG. 12 is a circuit schematic diagram of a reference memory like that of FIGS. 10 and 11. The reference memory includes an active slice 1220, and two floating slices 1221 and 1222, disposed on opposite sides of the active slice 1220. Each slice includes an array of memory cells in an x-z plane, where x is the word line direction and z is the vertical direction. The floating slices are not connected to local reference bit lines or the local reference source lines in this schematic. In some embodiments, the floating slices can be biased with a deselect voltage on the horizontal word lines.

A reference word line driver 1250 applies $V_{REF}$ to the selected word line 1251 of the active slice 1220. A deselect driver applies a deselect voltage to the unselected word lines (e.g. 1252) of the active slice. The local reference bit lines and local reference source lines of the reference memory connect as shown at 1258, to the corresponding vertical conductors in the active slice. The floating or inactive slices are not connected to the local reference bit lines and local reference source lines. In this example, the group of memory cells including cell 1271, used to generate the reference signal, includes four cells, and so there are four local reference bit lines and four local reference source lines. The local reference bit lines connect to reference bit line transistors 1261, which connect them together and to a global reference bit line 1265 in the conversion circuit, which generates a reference signal in response to the combined currents on the local reference bit lines of the selected group. The local reference source lines connect to reference source line transistors 1262, which connect them together and to a global reference common source line 1263.

The reference signal is applied on an output of the conversion circuit on line 1268 to a sense amplifier 1285.

Figure 13:
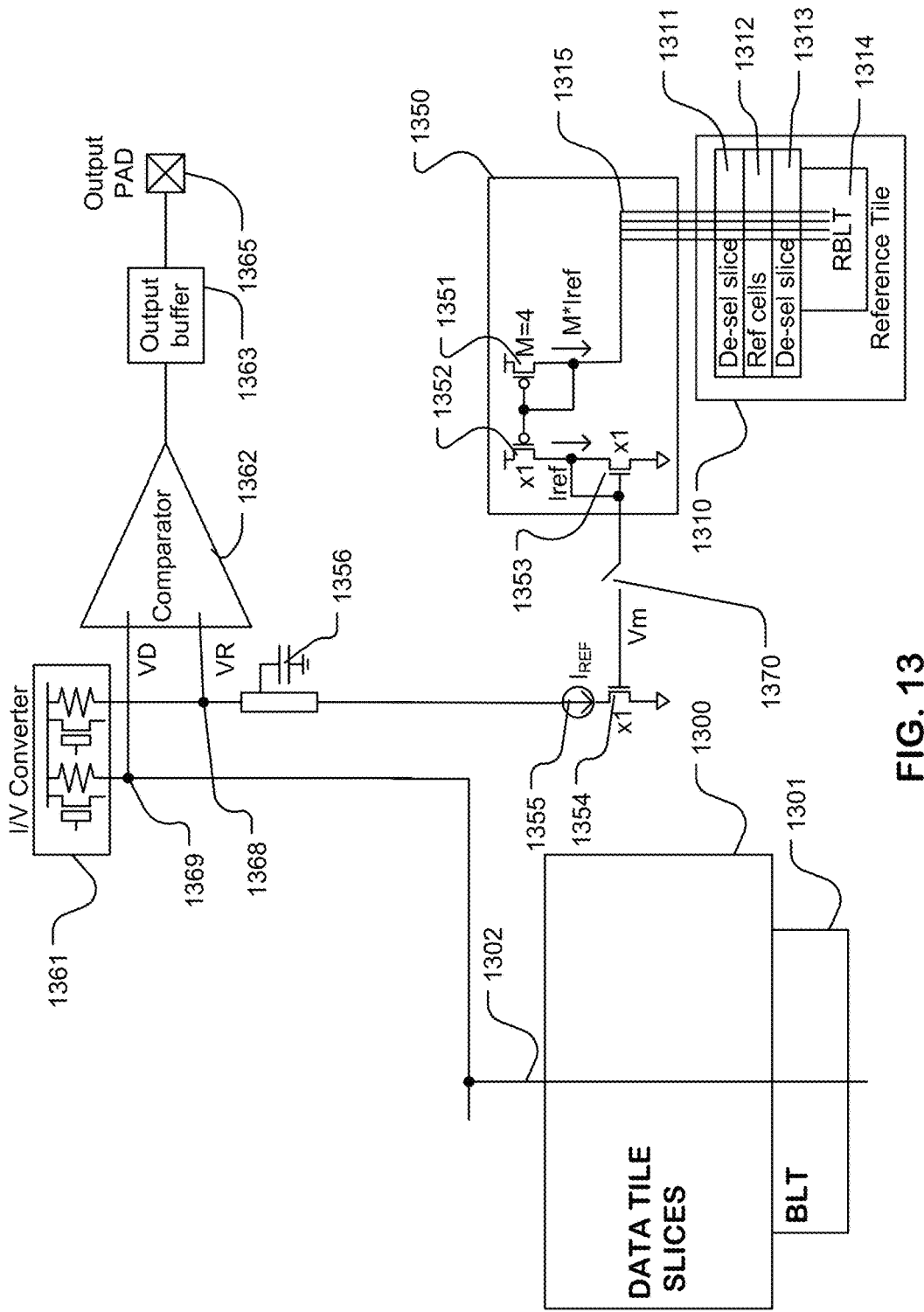
FIG. 13 is a diagram of an architecture for a memory device including a data memory and a reference memory.

FIG. 13 illustrates a memory device including a data memory, such as a tile including slices 1300, and bit line transistors 1301, which connect selected local bit lines (not shown) to a global bit line 1302. The global bit line connects to a current-to-voltage converter 1361 to produce a voltage VD at node 1369 on the input of a voltage comparator 1362. The current-to-voltage converter 1361 can be implemented in a variety of circuits, including for example a resistor or a transistor. The voltage VD represents the current in the global bit line from a selected memory cell during the read operation, and thereby data stored in the selected memory cell.

Also, the memory device includes a reference memory, such as reference tile 1310. The reference tile includes an active slice 1312 including a group of reference cells, and inactive slices 1311 and 1313 on opposing sides of the active slice. The inactive slices are floating, or biased in a deselected state. The reference tile includes reference bit line transistors 1314, which connect the local reference bit lines to a summing node 1315, in a conversion circuit 1350.

The conversion circuit includes a current mirror circuit which converts the sum of currents (M*Iref) from the group of cells in the active slice to a reference current Iref. The current mirror circuit illustrated includes a PMOS transistor (or transistors) 1351, having a relative effective channel width M=4. The drain of transistor 1351 is connected to the summing node 1315. The source of transistor 1351 is connected to VDD. The gate of transistor 1351 is connected to its drain. The current mirror circuit illustrated includes a PMOS transistor (or transistors) 1352, having a relative effective channel width M=1. The drain of transistor 1352 is connected to the drain of NMOS transistor 1353. The source of transistor 1352 is connected to VDD. The gate of transistor 1352 is connected to the gate of transistor 1351. Transistor 1353 has a source connected to ground, and a gate connected to its drain. In combination, transistors 1352 and 1353 mirror the current in transistor 1351, divided in magnitude by the ratio of the relative effective transistor widths of transistors 1351 and 1352.

The gate of NMOS transistor 1353 is used as a current mirror gate reference providing voltage Vm, at the gate of NMOS transistor 1354, to produce the reference current $I_{REF}$ 1355. A switch 1370 can be disposed between transistors 1353 and 1354 as illustrated to connect and disconnect the reference tile 1310.

In this embodiment, the signal $I_{REF}$ is applied to a current-to-voltage converter 1361, producing a reference signal VR at node 1368 on the input of a voltage comparator 1362. The current-to-voltage converter 1361 can be implemented in a variety of circuits, including for example, a resistor or a transistor. The reference signal from the group of memory cells is embodied by the voltage Vm, the current $I_{REF}$ and the voltage VR in this circuit.

The capacitance of the data path from the data memory to the comparator can be much different from the capacitance of the signal path from the reference memory to the comparator. In this embodiment, a capacitor 1356 is provided in the signal path from the reference memory to the comparator 1362. The capacitor 1356 can be implemented as described above with reference to the compensation capacitor 104 of FIG. 1. In one example, the capacitor 1356 is an MOS capacitor, including an MOS transistor having its source and drain connected together as one terminal and its gate as another terminal. Alternatively, a metal-insulator-metal MIM capacitor, or other capacitor structure, can be used. In some embodiments, the capacitor 1356 can comprise a dummy global bit line. In some embodiments, the capacitor 1356 can comprise a dummy global bit line combined with a trimming capacitor. The capacitor 1356 has a capacitance which compensates for the different capacitances on the reference signal path and the data signal path.

The output of the comparator 1362 is a data signal which is applied to data path circuits including, in this simplified example, an output buffer 1363, which in turn is connected to an input/output pad 1365 for the memory device.

Figure 14:
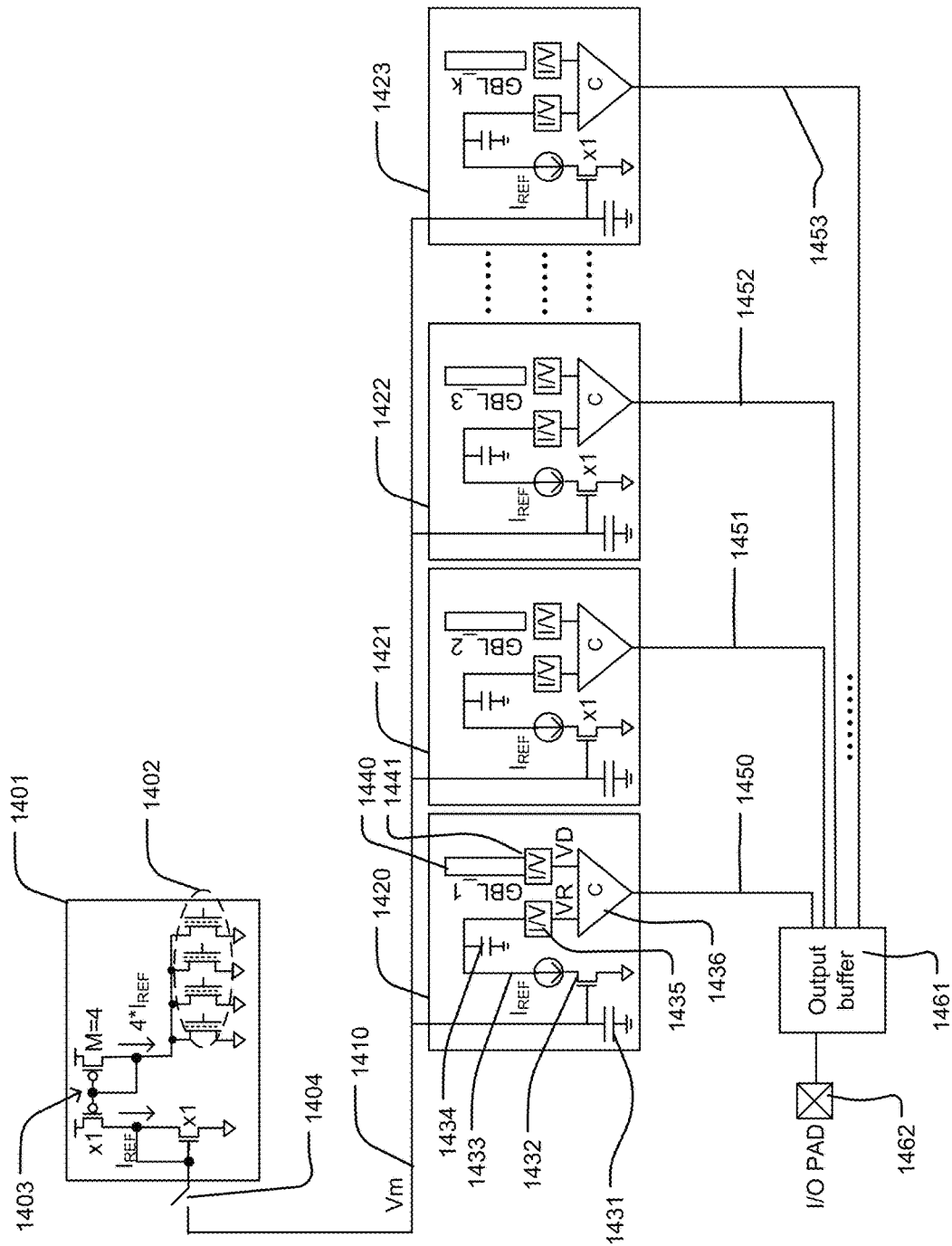
FIG. 14 illustrates the sensing circuit for a memory device including a plurality of sense amplifiers.

FIG. 14 illustrates an embodiment in which the reference memory is used to produce a current mirror reference Vm, and the current mirror reference Vm is distributed to a plurality of sense amplifiers, such as all the sense amplifiers in sense circuitry for a bank, or for a plane, or for multiple planes of memory cells in a layout like that of FIG. 1.

In FIG. 14, a module 1401 of the reference system includes the group 1402 of memory cells from the reference memory, which are coupled to a summing node and a current mirror circuit 1403. The current mirror circuit 1403 produces an output voltage Vm as discussed with reference to FIG. 13. The switch 1404 can be disposed in the circuit to connect or disconnect this module 1401 from the sense circuitry.

The signal Vm is applied on line 1410 to a plurality of sense modules 1420, 1421, 1422, 1423. Sense amplifiers in this embodiment can all have the same implementation. Thus, a representative sense module 1420 includes a capacitor 1431 connected to the signal line 1410 and to the gate of transistor 1432. The capacitor 1431 can operate to stabilize the signal Vm on line 1410. Transistor 1432 mirrors the current $I_{REF}$ from module 1401 to produce the current $I_{REF}$ on line 1433 in the sense module 1420. A load-balancing capacitor 1434 which compensates for the difference in loading between the reference memory and the data memory, is connected to line 1433. Line 1433 is connected to a current voltage converter 1435, which applies a voltage VR as an input to comparator 1436. The module 1420 is connected to a global bit line 1440 (e.g. GLB_1). Global bit line 1440 is connected to a current-to-voltage converter 1441, which applies a voltage VD at an input of the comparator 1436. The output of the comparator 1436 is a data signal on line 1450, which is connected to an output buffer 1461. The output buffer 1461 drives data signals on an I/O pad 1462 for the integrated circuit memory device.

Module 1421 produces a data signal on line 1451. Module 1422 produces a data signal on line 1452. Module 1423 produces a data signal on line 1453. Lines 1451, 1452, 1453 are connected to the output buffer 1461 as well.

In the embodiment of FIGS. 13 and 14, a single group of memory cells in the reference memory is used to produce a reference signal, which can be applied for sensing any memory cell in the data memory.

In some high density memory, including memory like that described above, the PVT conditions of memory cells in different parts of the data memory may be different. Embodiments of the reference system described herein can be designed to compensate for these differences.

Figure 15A:
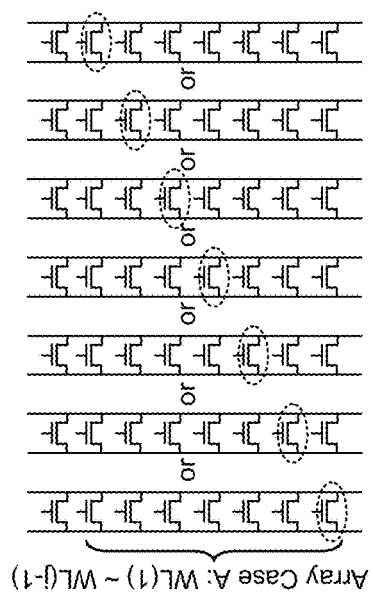
FIGS. 15A and 15B illustrate read access cases for a data memory which can be differentiated in the reference system.
Figure 15B:
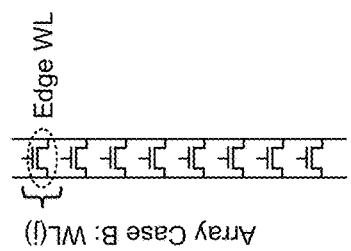

For example, FIG. 15A illustrates case A for read operations in the data memory of memory cells in the core of the array, where the core of the array includes memory cells on intermediate levels of the stack. A read which is addressed to a memory cell at the bottom level of the stack on word line WL(1), through intermediate level memory cells on word lines WL(2 to j-1) can be considered a read in a case A region. FIG. 15B illustrates a case B region for read operations in the data memory of memory cells in the top level of the array, on word line WL(j). The PVT conditions for case A can be significantly different than the PVT conditions for case B. Thus, the reference voltage to be used in sensing memory cells in the two cases can be fine-tuned as described herein.

Figure 16A:
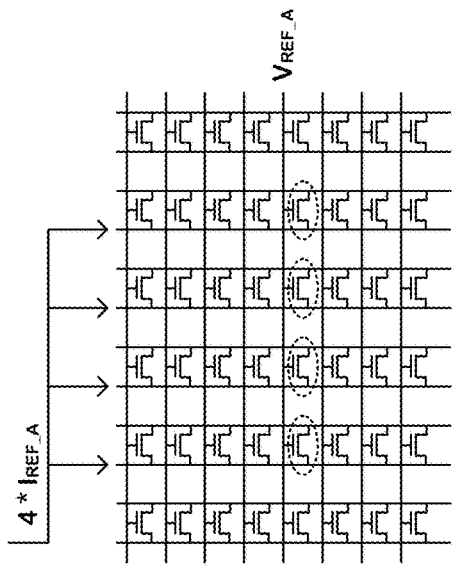
FIGS. 16A and 16B illustrate groups of memory cells in the reference memory which can be utilized to produce reference signals for the cases of FIGS. 15A and 15B.

One way to fine tune the reference voltage is to define the group of memory cells in the reference memory used to generate the reference voltage. Thus, FIG. 16A illustrates a group of memory cells in the reference memory which can be used in combination to produce a reference signal for case A. In FIG. 16A, the group of memory cells includes four members connected on a common word line which receives a reference voltage VREF_A, to produce current on four local reference bit lines. The four local reference bit lines are combined in a summing node as described above, in the conversion circuit to produce a reference voltage for case A.

Figure 16B:
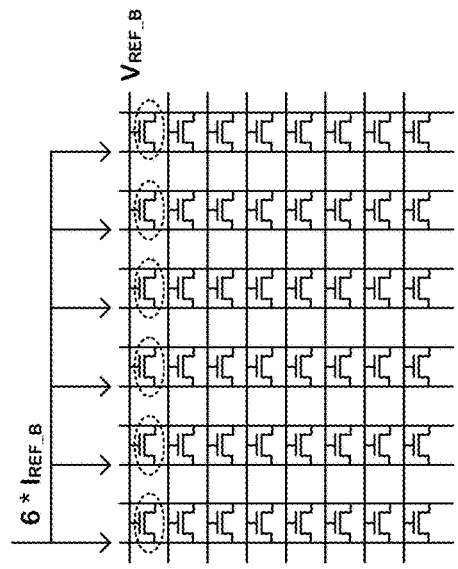

FIG. 16B illustrates a group of memory cells in the reference memory which can be used in combination to produce a reference signal for case B. In FIG. 16B, a group of memory cells includes six members connected to a word line at the top level in the reference memory, which receives a reference voltage VREF_B to produce current on six local reference bit lines. The six local reference bit lines are combined in a summing node as described above, in the conversion circuit to produce a reference voltage for case B.

The circuit in case B can include a current mirror circuit which divides the combined current from the reference memory by six, reflecting the use of six memory cells in the group of memory cells. In some embodiments, the group of memory cells used for case A is disposed in one slice of the reference memory, and the group of memory cells used for Case B is disposed in a different slice of the reference memory, on the same or different local reference bit lines. In other embodiments, the groups of memory cells used for case A and for case B can be disposed in the same slice of the reference memory on the same or different local reference bit lines.

Figure 17C:
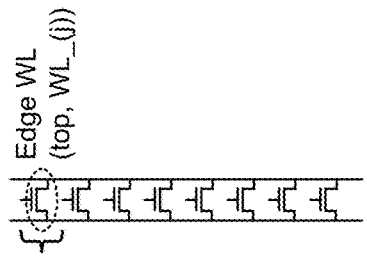
FIGS. 17A, 17B and 17C illustrate read access cases for a data memory can be differentiated in the reference system.
Figure 17B:
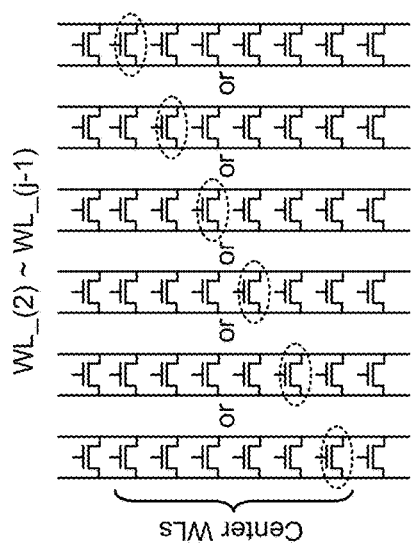
Figure 17A:
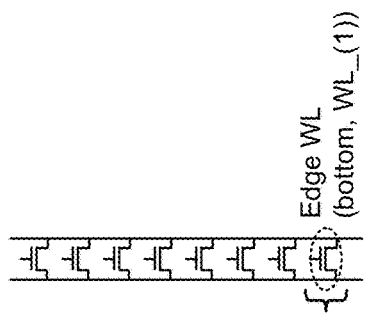

There can be more than two cases in a large high-density memory. For example, FIGS. 17A, 17B and 17C illustrate an embodiment with three cases. Case A, shown in FIG. 17A, includes accesses to the edge word line WL(1) at the bottom of the stack of word lines. Case B, shown in FIG. 17B, includes accesses to intermediate level word lines WL(2) to WL(j-1). Case C, shown in FIG. 17C, includes accesses to the edge word line WL(j) at the top of the stack of word lines. A reference system can include a reference memory having three different groups of memory cells, each group used for one of cases A, B and C.

Figure 18B:
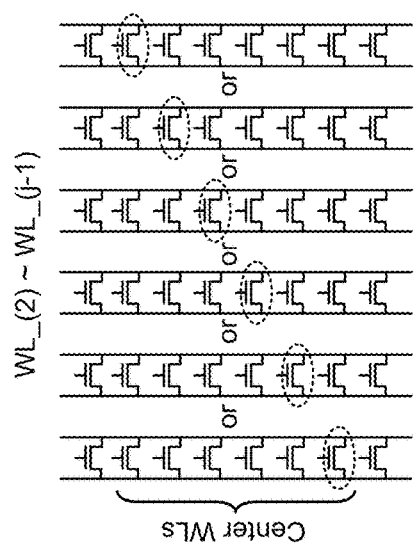
FIGS. 18A and 18B illustrate groups of memory cells in the reference memory which can be utilized to produce reference signals for the cases of FIGS. 17A, 17B and 17C.
Figure 18A:
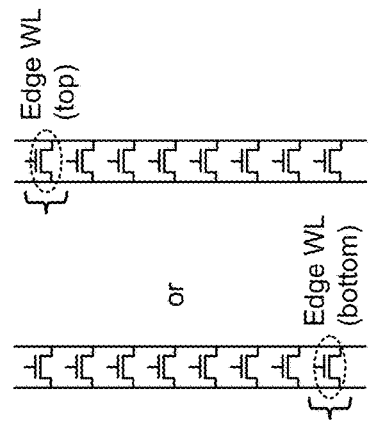

FIGS. 18A and 18B illustrate another embodiment, in which accesses to the data memory are grouped into two cases. FIG. 18A illustrates case A in which accesses to edge word lines at the bottom of the stack (WL(1)), and edge word lines at the top of the stack (WL(j)) both correspond to case A. FIG. 18B illustrates case B, in which accesses to intermediate word lines at word line levels WL(2) to WL(j-1) are considered case B.

Figure 19:
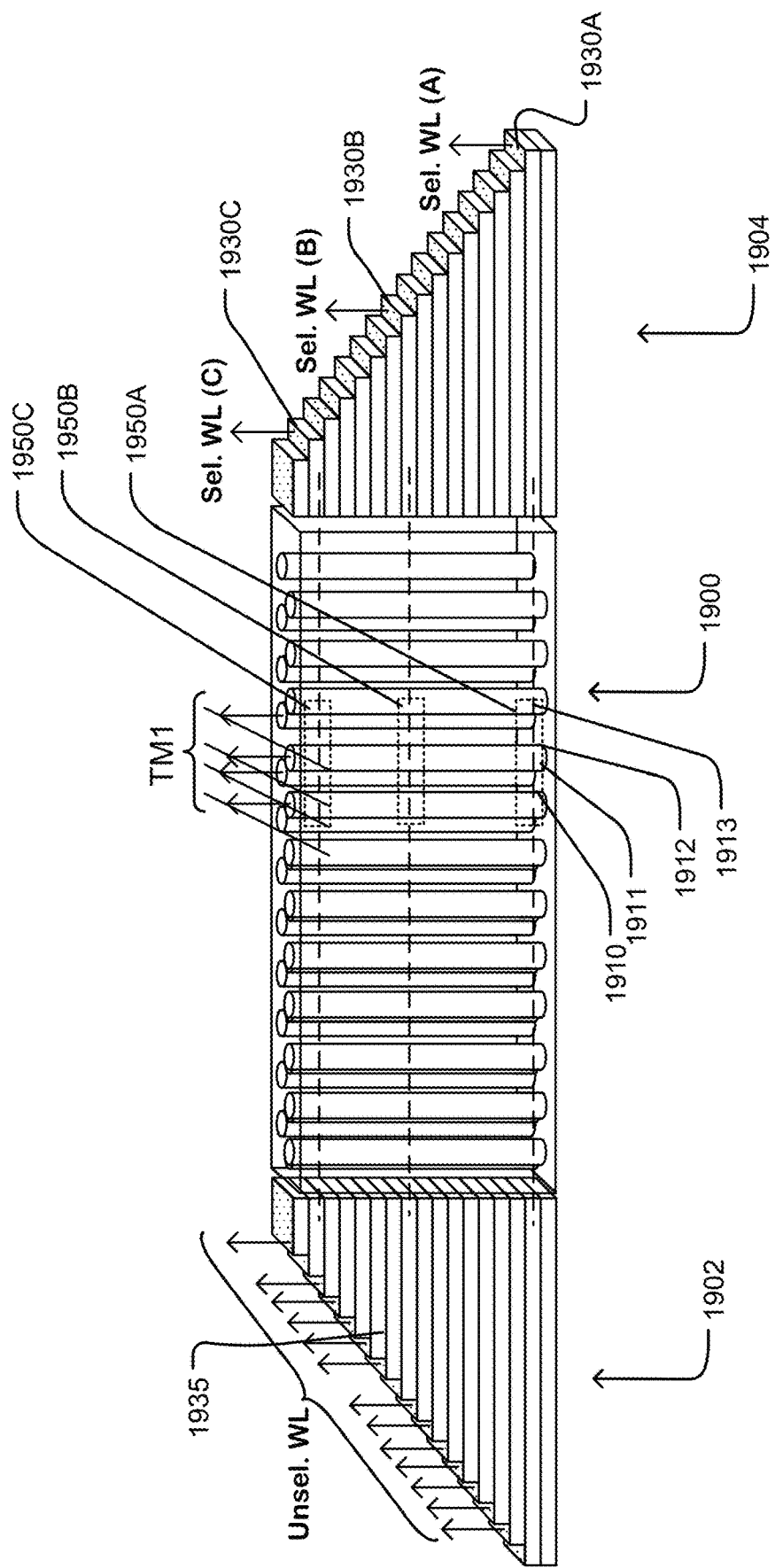
FIG. 19 is a perspective view of a slice of a memory structure like that of FIG. 10 including three groups of memory cells used for generation of reference signals.

FIG. 19 is a perspective view of a slice in the reference memory for one embodiment supporting cases A, B and C. The slice includes stairstep contact structures 1902 and 1904 on opposing ends, and a pillar region 1900. The horizontal word lines are not shown in the pillar regions for the purposes of this figure. The slice includes a plurality of pillars arranged in two offset rows as described with reference to FIG. 10. Three groups of memory cells (in locations 1950A, 1950B and 1950C) on pillars 1910, 1911, 1912, 1913 at the level of three different selected word lines 1930A, 1930B and 1930C are configured for generating the reference signals for the respective cases. The pillars 1910, 1911, 1912, 1913 are connected to respective local reference bit lines LRBLs, while the other pillars in the slice are not connected to local reference bit lines in this example. The local reference source lines are not shown in this illustration.

The selected word lines 1930A, 1930B and 1930C are connected to a word line driver or other bias circuit, applying $V_{REF\_A}$, $V_{REF\_B}$ and $V_{REF\_C}$, to the corresponding word lines. The unselected word lines (e.g. 1935) are connected to a word line driver or other bias circuit applying a deselect voltage such as ground.

Figure 20:
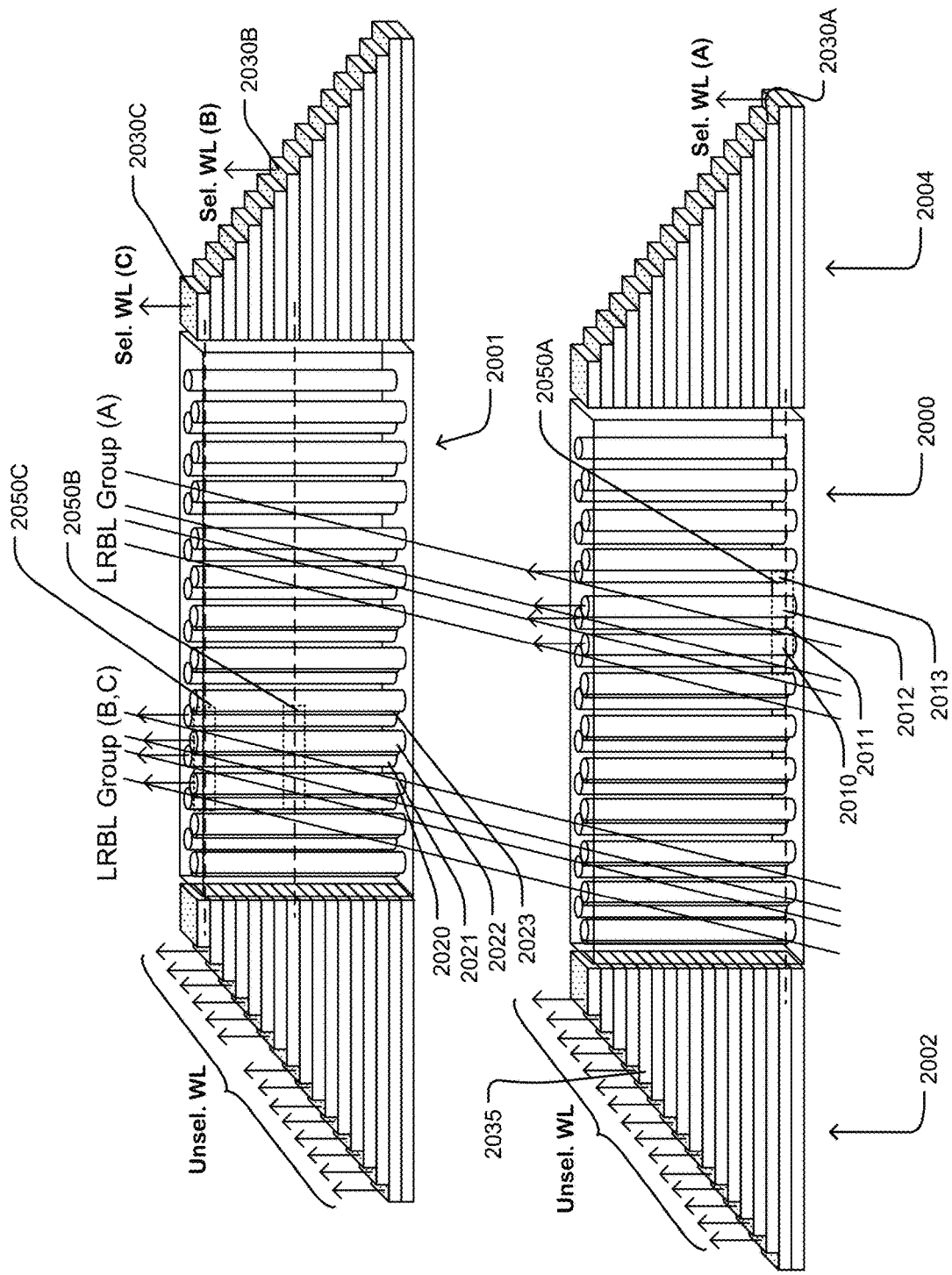
FIG. 20 is a perspective view of two slices of a memory structure like that of FIG. 10 including three groups of memory cells used for generation of reference signals.

FIG. 20 is a perspective view of two active slices in the reference memory for one embodiment supporting cases A, B and C. In embodiments such as FIG. 20 using more than one active slice, the active slices may be separated by inactive slices in the reference memory stack structure as described above. In other embodiments, the two active slices illustrated may be adjacent slices. Also there may be one or more inactive slices between the active slices. Also, the active slices may be disposed in separate reference memory stack structures in some embodiments.

The active slices shown in FIG. 20 each include stairstep contact structures (e.g. 2002 and 2004) on opposing ends, and respective pillar regions 2000 and 2001. The horizontal word lines are not shown in the pillar regions for the purposes of this figure. The slices each include a plurality of pillars arranged in two offset rows as described with reference to FIG. 10. A first group of memory cells in location 2050A in the pillar region 2000 of the first slice on pillars 2010, 2020, 2012, 2013 at the level of the selected word line 2030A in the bottom of the stack are configured for generating the reference signal for case A. The pillars 2010, 2011, 2012, 2013 are connected to respective local reference bit lines LRBLs of LBRL Group (A), while the other pillars in the first slice are not connected to local reference bit lines, in this example. The local reference source lines are not shown in this illustration.

A second group of memory cells in location 2050B in the pillar region 2001 of the second slice, and a third group of memory cells in location 2050C in the pillar region 2001 of the second slice on pillars 2020, 2021, 2022, 2023 at the level of two different selected word lines 2030B and 2030C are configured for generating the reference signal for cases B and C. The pillars 2020, 2021, 2022, 2023 are connected to respective local reference bit lines LRBLs of LBRL Group (B, C), while the other pillars in the second slice are not connected to local reference bit lines in this example. The local reference source lines are not shown in this illustration. In other embodiments, the numbers of local reference bit lines and the numbers of memory cells can vary among the cases as described with reference to FIGS. 16A and 16B.

The selected word lines 2030A, 2030B and 2030C are connected to a word line driver or other bias circuit, applying $V_{REF\_A}$, $V_{REF\_B}$ and $V_{REF\_C}$, to the corresponding word lines. The unselected word lines (e.g. 2035) are connected to a word line driver or other bias circuit applying a deselect voltage such as ground.

The local reference bit line groups LRBL Group (A) and LRBL (B, C) can be connected to separate conversion circuits, which are enabled when the data memory accesses a map to the respective cases. Alternatively, the local reference bit line groups LRBL Group (A) and LRBL (B, C) can be connected to a shared conversion circuit. Also, in other embodiments, as described with reference to FIG. 21, the conversion circuit can be configured with separate current mirror circuits.

Figure 21:
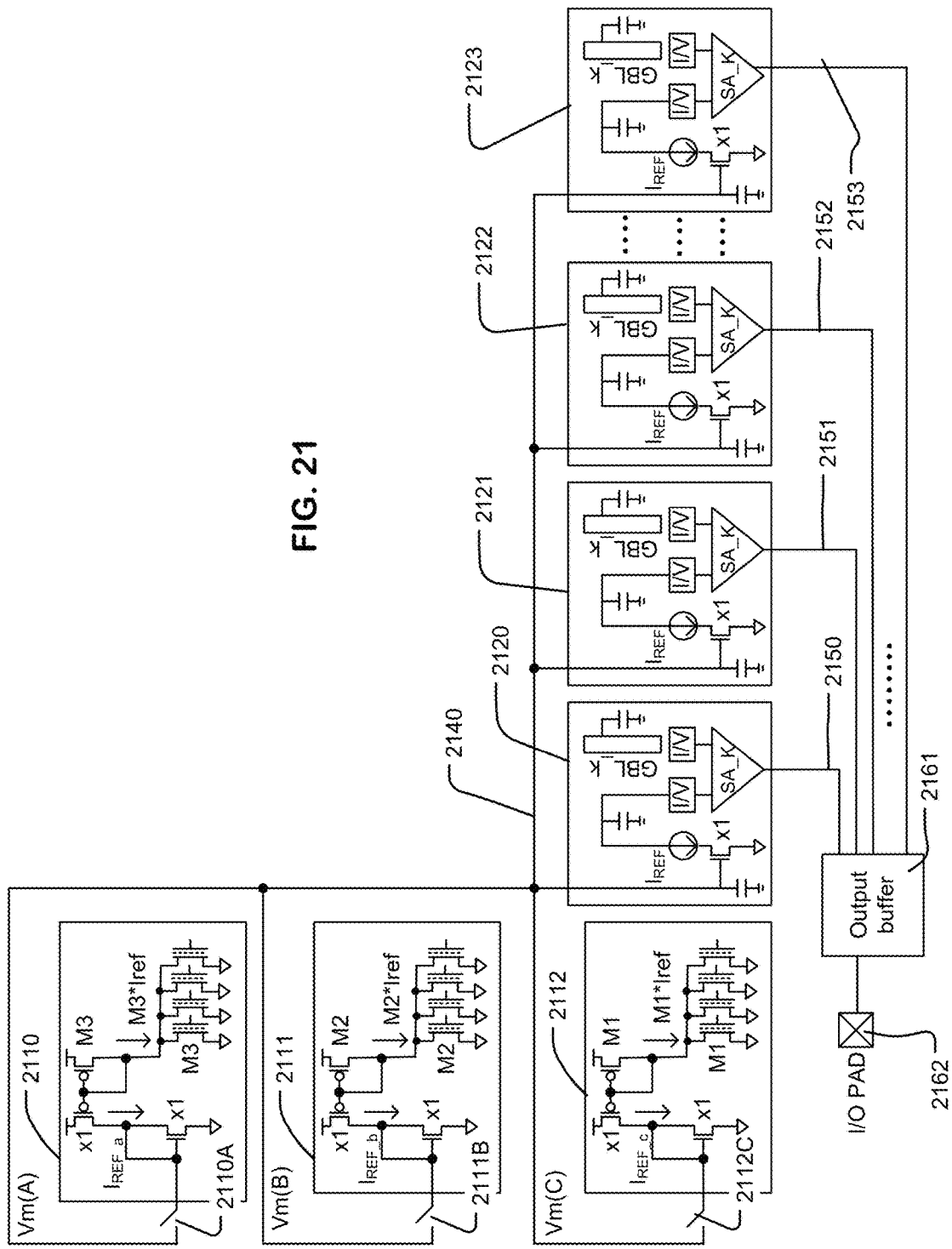
FIG. 21 illustrates the sensing circuit for a memory device including a plurality of sense amplifiers and supporting multiple read access cases.

FIG. 21 illustrates an embodiment in which the reference memory includes three modules 2110, 2111, 2112, of reference cells used to produce a plurality of current mirror reference signals, voltages Vm(A), Vm(B) and Vm(C) for cases A, B and C, respectively, involving accesses to different regions of the data memory. A selected one of the reference signals is distributed to a plurality of sense amplifiers, such as all the sense amplifiers in sense circuitry for a bank, or for a plane, or for multiple planes of memory cells in a layout like that of FIG. 1.

In FIG. 21, a module 2110 of the reference system includes a first group of memory cells from the reference memory, which is coupled to a summing node and a current mirror circuit. The current mirror circuit produces an output voltage Vm(A) as discussed with reference to FIG. 13. The switch 2110A can be disposed in the circuit to connect or disconnect this module 2110 from the sense circuitry.

A module 2111 of the reference system includes a second group of memory cells from the reference memory, which is coupled to a summing node and a current mirror circuit. The current mirror circuit produces an output voltage Vm(B) as discussed above. The switch 2111B can be disposed in the circuit to connect or disconnect this module 2111 from the sense circuitry.

A module 2112 of the reference system includes a third group of memory cells from the reference memory, which is coupled to a summing node and a current mirror circuit. The current mirror circuit produces an output voltage Vm(B) as discussed above. The switch 2112C can be disposed in the circuit to connect or disconnect this module 2112 from the sense circuitry.

The first, second and third groups of memory cells in the reference memory can be disposed on a single slice, or on multiple slices as described above. Also the first, second and third groups of memory cells in the reference memory can be disposed on a single set of local reference bit lines, or on multiple sets as described above. The first, second and third groups of memory cells in the reference memory can include the same number of reference memory cells, or can include different numbers of reference memory cells as described above.

The switches 2110A, 2111B and 2112C are controlled, for example, by the read state machine, which can determine a region of the data memory being accessed, based on the word line number, for example, or other addresses in the data memory. Based on the region being accessed, the state machine or other control circuit, determines which reference memory module will be connected to the sense circuitry for the data memory, closing the corresponding switch when the access to the data memory matches the region for which the module is configured.

The selected one of the signals Vm(A), Vm(B) and Vm(C), is applied on line 2140 to a plurality of sense amplifiers 2120, 2121, 2122, 2123. Sense amplifiers in this embodiment all have the same implementation as described in FIG. 14. Thus, sense amplifier 2120 includes a capacitor connected to the signal line 2140 and to the gate of a current mirror transistor. The transistor mirrors the current $I_{REF\_A}$, $I_{REF\_B}$ and $I_{REF\_C}$ from the selected module to produce the current $I_{REF}$ in the sense module 2120. A load-balancing capacitor which compensates for the difference in loading between the reference memory and the data memory, is connected to the data path. The current is applied to a current-to-voltage converter, which applies a voltage VR as an input to a comparator. The module 2120 is connected to a global bit line (e.g. GLB_1). The global bit line is also connected to a current-to-voltage converter, which applies a voltage VD at an input of the comparator. The output of the comparator is a data signal on line 2150, which is connected to an output buffer 2161. The output buffer 2161 drives data signals on an I/O pad 2162 of the integrated circuit memory device.

Sense module 2121 produces a data signal on line 2151. Sense module 2120 produces a data signal on line 2152. Sense module 2123 produces a data signal on line 2153. Lines 2151, 2152, 2153 are connected to the output buffer 2161 as well.

Figure 22:
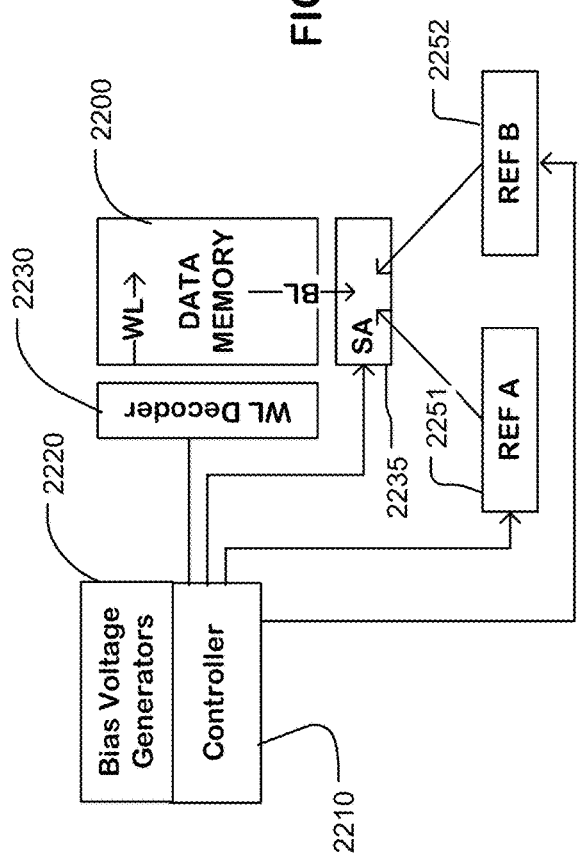
FIG. 22 is a simplified block diagram of an integrated circuit memory device including two groups of reference cells in a reference memory.

FIG. 22 is a simplified block diagram of a memory device which can be implemented on a single integrated circuit, which utilizes a first group 2251 of reference memory cells for case A and a second group 2252 of reference memory cells for case B. The memory includes a data memory 2200 with peripheral circuits including a word line decoder 2230 which drives selected word lines in the data memory, and sense amplifiers 2235 which sense data on unselected bit lines in the data memory. The memory device includes a controller 2210, and bias voltage generators 2220 which include state machines or other circuitry to implement read, program, erase and other operations for the data memory. In addition, the controller 2210 and bias voltage generators 2220 are coupled to the reference memory system, including the first group 2251 and the second group 2252 of reference memory cells. In operation, the controller determines the region in the data memory being accessed by a current read operation, and enables one of the first group 2251 and the second group 2252 for the purposes of generating a reference signal to be utilized in the sense amplifiers 2235.

As described above, the region in the data memory corresponding to case A can include memory cells located on edge word lines, such as the top level word lines, the bottom level word lines, or both top and bottom level word lines. The region in the data memory corresponding to case B can include all other memory cells on the intermediate levels of the word lines.

Case A can be extended, for example, to include accesses that are directed to the two bottommost levels of the word lines, rather than just one bottom level.

Also, case A and case B might apply to different groups of tiles in a large-scale memory like that of FIG. 1. For example, case A might apply to edge tiles around the periphery of the array of tiles, while case B may be applied to interior tiles. More generally, case A and case B can be designed according to the particular implementation of the data memory, to include in the region having relatively similar PVT conditions so that they can be effectively sensed using a single group of memory cells in the reference memory.

Figure 23:
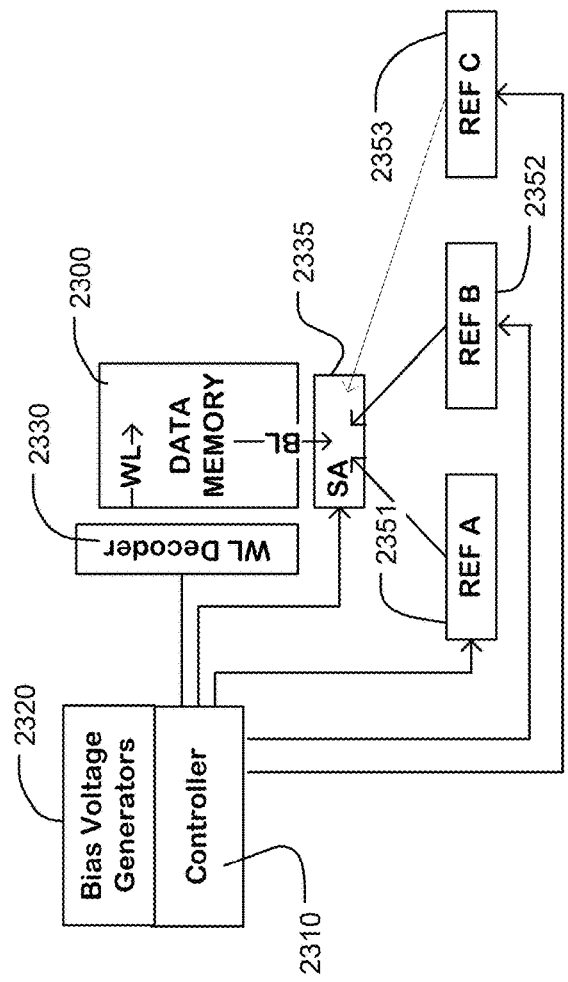
FIG. 23 is a simplified block diagram of an integrated circuit memory device including three groups of reference cells in a reference memory.

FIG. 23 is a simplified block diagram of a memory device which can be implemented on a single integrated circuit chip or multichip module, which utilizes a first group 2351 of reference memory cells for case A, a second group 2352 of reference memory cells for case B or a third group 2353 of reference memory cells for case C. The technology can be extended to any number of reference memory cell groups.

The memory includes a data memory 2300 with peripheral circuits including a word line decoder 2330 which drives selected word lines in the data memory, and sense amplifiers 2335 which sense data on unselected bit lines in the data memory. The memory device includes a controller 2310, and bias voltage generators 2320 which include state machines or other circuitry to implement read, program, erase and other operations for the data memory. In addition, the controller 2310 and bias voltage generators 2320 are coupled to the reference memory system, including the first group 2351 and the second group 2352 of reference memory cells. In operation, the controller determines the region in the data memory being accessed by a current read operation, and enables one of the first group 2351 and the second group 2352 for the purposes of generating a reference signal to be utilized in the sense amplifiers 2335.

As mentioned above with respect to FIGS. 10 and 10A, the memory device can include program and program verify circuits (e.g. in peripheral circuits 1090) for the reference memory. The program and program verify circuits can be utilized to trim the thresholds of the memory cells in the reference memory so that they operate within expected targets. For example, the designer can specify a target magnitude for the current $I_{REF}$. This magnitude may be for example 10 µA. Program and program verify circuits can be connected to the reference bit line, and be executed to establish a combined magnitude for the group of reference memory cells, including a number of reference memory cells, to be applied, so that the combined current on the reference bit line is equal to the target magnitude times the number of reference memory cells. For an embodiment including four reference memory cells, with a target magnitude of 10 µA, the thresholds of the reference memory cells in the group are trimmed to establish a combined current of 40 µA. Memory cells in the reference memory that are not used can be programmed to high threshold values so that they are not conducted during operation.

Figure 24:
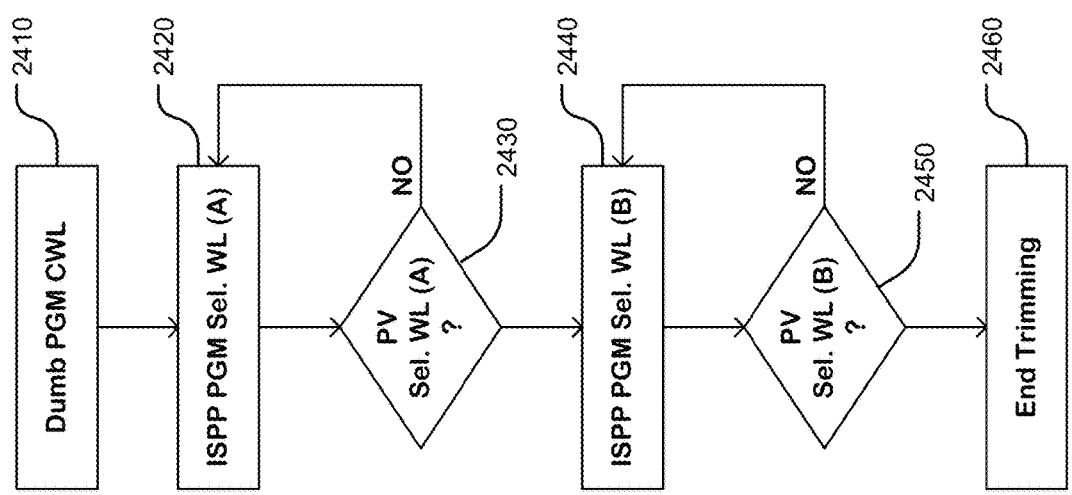
FIG. 24 is a flowchart of a procedure which can be executed by control circuitry to program threshold voltages of memory cells in a reference memory.

FIG. 24 is a simplified flowchart illustrating the control algorithm which can be executed by the controller and bias circuitry associated with reference memory. This algorithm can be executed in the field in some embodiments periodically as necessary to restore the condition of the reference memory. In other embodiments, this algorithm can be executed only once during manufacture, or after deploying the device in the field.

In this example, the algorithm begins by applying a "dumb" program cycle to unselected word lines which are connected in common by a word line driver (2410). A dumb program cycle might comprise simply applying a single high-voltage program pulse sufficient to increase the threshold to a high threshold state. Next, the algorithm applies a program algorithm to the selected word line for group A memory cells which are disposed on word line (A) which can be used to trim the magnitude of the combined output current. For example, an incremental step pulse program algorithm ISPP can be utilized to trim the threshold voltages of the memory cells in the group on word line (A) to be utilized in case A. This involves applying a pulse (2420), and then verifying whether the magnitude of the combined output current satisfies the condition (2430). The verify operation can utilize a bandgap reference circuit among the bias voltage generators on the chip, to provide a reference signal against which to trim the threshold of the memory cells in the reference memory. If it does not pass verify, then the algorithm loops to step 2420 to apply another pulse, which can be incrementally higher. If at step 2430, the group to be used for case A passes verify, then the controller proceeds to apply a program algorithm to the selected word line for group B. This involves applying a pulse (2440) to word line (B), followed by verifying whether the current generated by the group of memory cells to be used for case B satisfies the condition (2450). If at step 2450, the group used for case B does not pass verify, then the algorithm loops back to step 2440 to apply a next pulse. If at step 2450, the group used for case B passes verify, then the training algorithm ends (2460).

This reference memory program operation can be executed under control of logic in a wafer sort machine at a manufacturing plant, or in on chip control circuits. Basically, a sense amplifed can be deployed including an output latch, connected to selected local bit line in the reference memory. The logic can include a sequence such as:

1) Input a code at the latch (e.g., "1") as the flag.
2) ISPP PGM (1st pulse, initial bias from control circuit)
3) If program verify PV step detects cell Vt<reference Vt, the code of latch is kept.
4) ISPP PGM (2nd pulse, higher WL bias provided by control circuit)
5) If PV step detects cell Vt<reference Vt, the code of latch is kept.
. . .
6) ISPP PGM (nth pulse, Vg0+(n-1)*Vstep)
7) If PV step detects cell Vt>reference Vt, the code of latch is changed. Therefore, the control circuit will stop the Vt trimming algorithm.

Embodiments of the reference system technology described herein have been applied to NOR-architecture and AND-architecture memory devices, using dielectric charge trapping storage elements. The reference system technology described herein can also be applied for other types of memory architectures, and to other storage types of storage elements.

A memory is described, comprising a data memory comprising a plurality of memory cells on a plurality of bit lines; a reference memory comprising a plurality of memory cells; conversion circuitry to convert signals from a group of memory cells including more than one member in the plurality of memory cells in the reference memory into a reference signal; and a sense amplifier, connected to the conversion circuitry and to a bit line in the plurality of bit lines in the data memory, to sense data stored in a selected memory cell in the data memory in response to comparison of a data signal from the selected memory cell and the reference signal. The memory thus described, can include any of the technologies described herein as suits a particular implementation.

Also, a memory is described, comprising a data memory comprising a plurality of memory cells on a plurality of bit lines; a reference memory comprising a plurality of memory cells, the reference memory including inactive memory cells and an active group of memory cells, the active group of memory cells connected to local reference bit lines, and to a reference word line; conversion circuitry to convert signals on the local reference bit lines from the active group of memory cells into a reference signal; and a sense amplifier, connected to the conversion circuitry and to a bit line in the plurality of bit lines in the data memory, to sense data stored in a selected memory cell in the data memory in response to a data signal from the selected memory cell and the reference signal. The memory thus described, can include any of the technologies described herein as suits a particular implementation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory, comprising:
   a data memory comprising a plurality of memory cells on a plurality of bit lines;
   a reference memory comprising a plurality of memory cells;
   conversion circuitry to convert signals from a group of memory cells including more than one member in the plurality of memory cells in the reference memory into a reference signal; and
   a sense amplifier, connected to the conversion circuitry and to a bit line in the plurality of bit lines in the data memory, to sense data stored in a selected memory cell in the data memory in response to comparison of a data signal from the selected memory cell and the reference signal,
   wherein the group of memory cells is disposed on a plurality of local reference bit lines,
   wherein the local reference bit lines include vertical connectors extending to a reference bit line transistor region,
   wherein the reference memory comprises a stack of horizontal word lines in respective levels of the stack and a set of vertical conductors, and the memory cells in the reference memory have horizontal channels between adjacent vertical conductors at the levels of horizontal word lines in the stack, and
   wherein the local reference bit lines are disposed in a patterned conductor layer over the stack.

2. The memory of claim 1, wherein the group of memory cells is disposed on a plurality of local reference bit lines, the plurality of local reference bit lines being connected together for program operations in the reference memory.

3. The memory of claim 1, wherein the set of vertical conductors includes vertical conductors extending to local reference source lines, and vertical conductors extending to local reference bit lines, and the reference memory includes reference bit line transistors to connect local reference bit lines of the group of memory cells in the conversion circuitry.

4. The memory of claim 1, wherein the stack is disposed over a circuit level on a substrate, and reference bit line transistors are disposed in a reference bit line transistor region in the circuit level adjacent to the stack.

5. The memory of claim 1, wherein conversion circuitry comprises a current mirror circuit which produces a reference current in response to combined current from the group of memory cells, and a current-to-voltage converter.

6. The memory of claim 1, wherein the memory cells in the group of memory cells are disposed on a reference word line, and including a reference word line driver to apply a word line reference voltage to the reference word line, and to apply a deselect voltage to other word lines in the reference memory.

7. The memory of claim 1, wherein the reference memory comprises a stack structure including a plurality of slices, each slice including a stack of horizontal word lines in respective levels of the stack and a set of vertical conductors, and the memory cells in the reference memory have horizontal channels between adjacent vertical conductors at the levels of horizontal word lines in the stack, and wherein the group of memory cells is disposed in one of the slices of the plurality of slices, and the stack of horizontal word lines includes a reference word line for the group of memory cells, and including a reference word line driver to apply a word line reference voltage to the reference word line, and to apply a deselect voltage to other word lines in the reference memory.

8. A memory, comprising:
   a data memory comprising a plurality of memory cells on a plurality of bit lines;
   a reference memory comprising a plurality of memory cells;
   conversion circuitry to convert signals from a group of memory cells including more than one member in the plurality of memory cells in the reference memory into a reference signal; and
   a sense amplifier, connected to the conversion circuitry and to a bit line in the plurality of bit lines in the data memory, to sense data stored in a selected memory cell in the data memory in response to comparison of a data signal from the selected memory cell and the reference signal;
   wherein the reference memory comprises a stack structure including a plurality of slices, each slice including a stack of horizontal word lines in respective levels of the stack and a set of vertical conductors, and the memory cells in the reference memory have horizontal channels between adjacent vertical conductors at the levels of horizontal word lines in the stack, and wherein at least one of the plurality of slices includes the group of memory cells and at least one other one of the plurality of slices is disconnected from the conversion circuit.

9. A memory, comprising:

a data memory comprising a plurality of memory cells on a plurality of bit lines;

a reference memory comprising a plurality of memory cells, the reference memory including inactive memory cells and an active group of memory cells, the active group of memory cells connected to local reference bit lines, and to a reference word line;

conversion circuitry to convert signals on the local reference bit lines from the active group of memory cells into a reference signal; and a sense amplifier, connected to the conversion circuitry and to a bit line in the plurality of bit lines in the data memory, to sense data stored in a selected memory cell in the data memory in response to a data signal from the selected memory cell and the reference signal, wherein the reference memory comprises a stack structure including a plurality of slices, each slice including a stack of horizontal word lines in respective levels of the stack, the stack in one of the plurality of slices including a reference word line, and a set of vertical conductors, and memory cells having horizontal channels between adjacent vertical conductors at the levels of horizontal word lines in the stack, and wherein the active group of memory cells is disposed in a first slice, and memory cells in the other slices having vertical conductors not connected to local reference bit lines.

10. The memory of claim 9, including a word line driver connected to the reference word line to apply a word line reference voltage and connected to other word lines in the reference memory to apply a deselect voltage.

11. The memory of claim 9, wherein the conversion circuitry includes a summing node to sum current from the local reference bit lines to form a combined current, and a current mirror circuit to convert the combined current to a reference current having reduced magnitude.

12. The memory of claim 11, wherein the conversion circuitry includes a current-to-voltage converter to convert the reference current to a reference voltage, and to apply the reference voltage to the sense amplifier.

13. The memory of claim 9, including a control circuit to program the inactive memory cells to a first threshold state, and to program the active group of memory cells to a second threshold state lower than the first threshold state.

14. The memory of claim 13, wherein the control circuit applies an incremental step pulse program operation to the active group of memory cells to set the second threshold state.

15. The memory of claim 9, including a control circuit to program the active group of memory cells using an incremental step pulse program operation.

16. The memory of claim 9, wherein the reference memory comprises a stack structure including a plurality of slices, each slice including a stack of horizontal word lines in respective levels of the stack and a set of vertical conductors, and the memory cells in the reference memory have horizontal channels between adjacent vertical conductors at the levels of horizontal word lines in the stack, and wherein the active group of memory cells is disposed in one of the slices of the plurality of slices, and the stack of horizontal word lines includes the reference word line for the active group of memory cells, and including a reference word line driver to apply a word line reference voltage to the reference word line, and to apply a deselect voltage to other word lines in the reference memory.

17. The memory of claim 9, wherein the reference memory comprises a stack structure including a plurality of slices, each slice including a stack of horizontal word lines in respective levels of the stack and a set of vertical conductors, and the memory cells in the reference memory have horizontal channels between adjacent vertical conductors at the levels of horizontal word lines in the stack, and wherein the active group of memory cells is disposed in one of the slices of the plurality of slices, and the stack of horizontal word lines includes the reference word line for the active group of memory cells, and wherein at least one of the plurality of slices includes the active group of memory cells and at least one other one of the plurality of slices is disconnected from the conversion circuitry.

* * * * *